(12) United States Patent
Yaguchi et al.

(10) Patent No.: US 11,065,491 B2
(45) Date of Patent: Jul. 20, 2021

(54) VORTEX WATER FLOW GENERATOR, WATER PLASMA GENERATOR, DECOMPOSITION PROCESSOR, DECOMPOSITION PROCESSOR MOUNTED VEHICLE, AND DECOMPOSITION METHOD

(71) Applicant: HELIX CO., LTD., Kanagawa (JP)

(72) Inventors: Hirofumi Yaguchi, Kanagawa (JP); Takayuki Watanabe, Fukuoka (JP)

(73) Assignee: HELIX CO., LTD, Kanagawa (JP)

( * ) Notice: Subject to any disclaimer, the term of this patent is extended or adjusted under 35 U.S.C. 154(b) by 581 days.

(21) Appl. No.: 16/067,670

(22) PCT Filed: Dec. 22, 2016

(86) PCT No.: PCT/JP2016/088498
§ 371 (c)(1),
(2) Date: Jul. 2, 2018

(87) PCT Pub. No.: WO2017/119326
PCT Pub. Date: Jul. 13, 2017

(65) Prior Publication Data
US 2019/0001171 A1    Jan. 3, 2019

(30) Foreign Application Priority Data

Jan. 5, 2016 (JP) ................. 2016-000527
Jan. 5, 2016 (JP) ............. JP2016-000519

(51) Int. Cl.
*H05H 1/42*       (2006.01)
*A62D 3/30*       (2007.01)
*B01J 19/00*      (2006.01)
*B01J 19/08*      (2006.01)
*B01J 19/24*      (2006.01)
*B01J 19/26*      (2006.01)
*H05H 1/48*       (2006.01)

(52) U.S. Cl.
CPC ............ *A62D 3/30* (2013.01); *B01J 19/0013* (2013.01); *B01J 19/088* (2013.01); *B01J 19/2405* (2013.01); *B01J 19/26* (2013.01); *H05H 1/42* (2013.01); *H05H 1/48* (2013.01); *B01J 2219/00119* (2013.01); *B01J 2219/082* (2013.01); *B01J 2219/083* (2013.01); *B01J 2219/0809* (2013.01); *B01J 2219/0818* (2013.01); *B01J 2219/0835* (2013.01); *B01J 2219/0839* (2013.01); *B01J 2219/0841* (2013.01); *B01J 2219/0871* (2013.01); *B01J 2219/0877* (2013.01); *B01J 2219/0896* (2013.01)

(58) Field of Classification Search
CPC ....... A62D 3/30; B01J 19/0013; B01J 19/088; B01J 19/2405; B01J 19/26; B01J 2219/00119; B01J 2219/0809; B01J 2219/0818; B01J 2219/082; B01J 2219/083; B01J 2219/0835; B01J 2219/0839; B01J 2219/0841; B01J 2219/0871; B01J 2219/0877; B01J 2219/0896; H05H 1/42; H05H 1/48
USPC ......................................................... 588/313
See application file for complete search history.

(56) References Cited

U.S. PATENT DOCUMENTS

| | | | |
|---|---|---|---|
| 4,531,043 | A | 7/1985 | Zverina et al. |
| 4,620,080 | A | 10/1986 | Arata et al. |
| 9,150,949 | B2 | 10/2015 | Belashchenko |
| 2016/0024635 | A1 | 1/2016 | Belashchenko |

FOREIGN PATENT DOCUMENTS

| | | |
|---|---|---|
| JP | 56-152198 | 11/1981 |
| JP | 58-192683 | 11/1983 |
| JP | 61-13600 | 1/1986 |
| JP | 63-58799 | 3/1988 |
| JP | 1-148472 | 6/1989 |
| JP | 2003-24902 | 1/2003 |
| JP | 3408779 | 5/2003 |
| JP | 2008-272565 | 11/2008 |
| JP | 2015-513776 | 5/2015 |
| WO | 2012/031338 | 3/2012 |

OTHER PUBLICATIONS

Official Communication issued in International Bureau of WIPO Patent Application No. PCT/JP2016/088498, dated Feb. 28, 2017.

*Primary Examiner* — Edward M Johnson
(74) *Attorney, Agent, or Firm* — Greenblum & Bernstein, P.L.C.

(57) ABSTRACT

A vortex water generator forms a vortex water flow for passing arc discharge. The vortex water flow generator includes a cylindrical portion configured to form a vortex water flow along an inner circumference; first middle partition and second middle partition protruding from the inner circumference of the cylindrical portion, a rear partition formed in a rear end side of the cylindrical portion, and a front partition provided in a front end side of the cylindrical portion. Each partition has an opening to include a center axis line position of the cylindrical portion. Each opening has a different opening shape in size. The middle partition and the front partition have negative electrode side surfaces formed by tapered surfaces receding from the negative electrode as close to the center axis line. Arc-shaped beveled portions are formed between the tapered surfaces and inner circumferential surfaces of the openings.

18 Claims, 18 Drawing Sheets

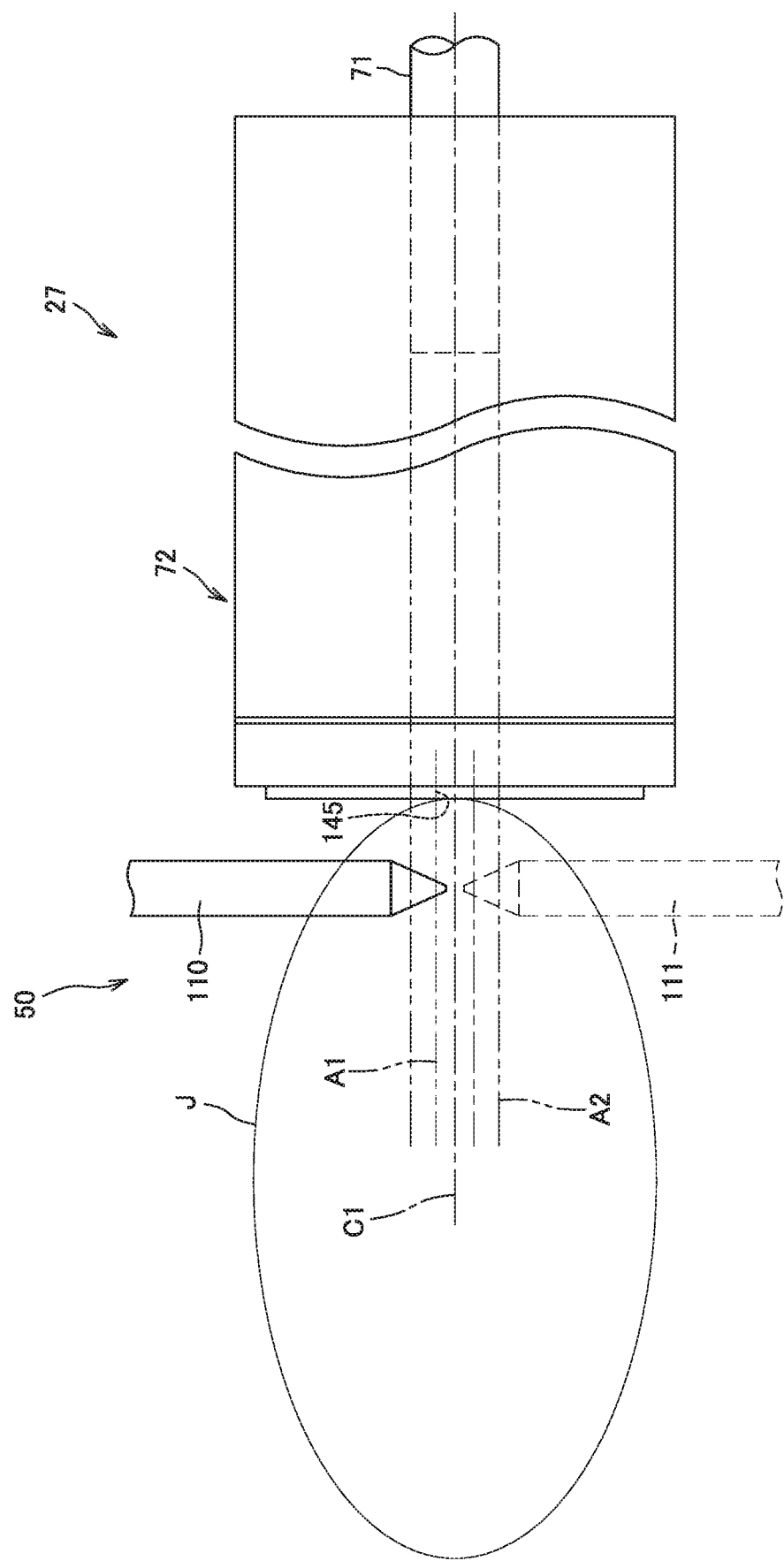

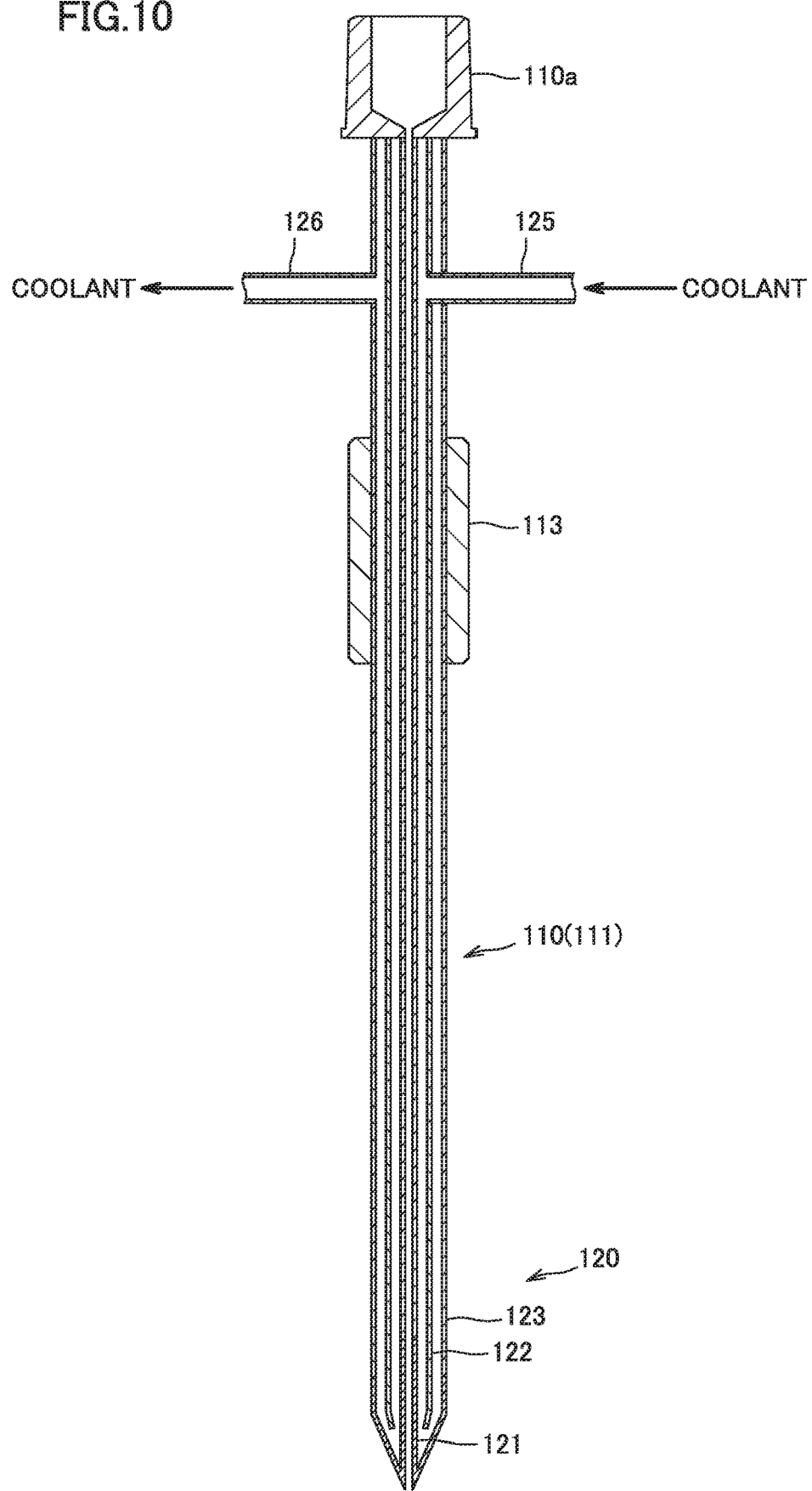

VORTEX WATER FLOW GENERATOR, WATER PLASMA GENERATOR, DECOMPOSITION PROCESSOR, DECOMPOSITION PROCESSOR MOUNTED VEHICLE, AND DECOMPOSITION METHOD

FIELD OF THE INVENTION

The present invention relates to a vortex water flow generator, a water plasma generator, a decomposition processor, a decomposition processor mounted vehicle, and a decomposition method, used to inject water plasma using arc discharge generated between negative and positive electrodes.

BACKGROUND OF THE INVENTION

An apparatus for disposing waste using a water plasma technology is known in the art as discussed in Patent Document 1. In the apparatus of Patent Document 1, incinerated ashes are supplied to a water plasma jet stream generated from arc discharge by using water as a plasma stabilizing medium and are dissolved. The water plasma jet stream is injected from a water plasma burner, which includes negative and positive electrodes for generating arc discharge and a chamber arranged in an end side of the negative electrode to generate a vortex water flow.

The chamber of the water plasma burner has a circular cylindrical shape and includes a cylindrical portion configured to receive introduced high-pressure water and partitions provided in both end portions and an inner circumference of the cylindrical portion to generate a vortex water flow by causing the introduced high-pressure water flow to follow an inner circumferential surface of the cylindrical portion. Each partition has an opening formed in a center axis line position of the cylindrical portion. The high-pressure water that forms the vortex water flow is partially converted into water plasma, and the remaining parts are discharged to the outside of the cylindrical portion through each opening.

CITATION LIST

Patent Documents

Patent Document 1: Japanese Patent No. 3408779

SUMMARY OF THE INVENTION

The water plasma burner injects water plasma by generating arc discharge through a cavity in the center of the vortex water flow. Therefore, if the cavity is not provided, arc discharge is not generated even by introducing the high-pressure water to the chamber, and further, it is difficult to inject water plasma. In this regard, the inventors made diligent studies by repeating trial and errors and found that the shapes of the openings of each partition are very important in order to stably provide a cavity in a vortex water flow. That is, the inventors invented an opening structure capable of more stably injecting water plasma, compared to the technique of Patent Document 1 in which each opening has the same shape.

In view of the aforementioned demands, it is therefore an object of the present invention to provide a vortex water flow generator, a water plasma generator, a decomposition processor, a decomposition processor mounted vehicle, and a decomposition method, capable of stabilizing injection of the water plasma.

According to an aspect of the invention, there is provided a vortex water flow generator placed between a negative electrode and a positive electrode of a water plasma generator that injects a water plasma. The water plasma becomes a jet stream by dissociating or ionizing water to form a vortex water flow having a cavity for passing arc discharge generated between the negative and positive electrodes. The vortex water flow generator includes: a cylindrical portion configured to form the vortex water flow along an inner circumference; a middle partition protruding from the inner circumference of the cylindrical portion; a one-end-side partition disposed in one end side of the cylindrical portion to face the negative electrode; and the-other-end-side partition disposed in the other end side of the cylindrical portion. Each of the partitions has an opening in a position including a center axis line of the cylindrical portion. The openings have different opening shapes in size. The middle partition and the-other-end-side partition have surfaces at the negative electrode side. The surfaces are formed by tapered surfaces gradually receding from the negative electrode as close to the center axis line. An arc-shaped beveled portion is formed between the tapered surface and an inner circumferential surface of the opening.

In this configuration, a plurality of openings formed side by side along the center axis line of the cylindrical portion have different opening shapes in size. Therefore, it is possible to improve freedom of adjustment for the amount of water flowing across the partitions. As a result, it is possible to employ various opening shapes to appropriately provide a cavity in the vortex water flow. In addition, it is possible to stably inject water plasma. Furthermore, by providing the arc-shaped beveled portions, it is possible to suppress resistance to the vortex water flow and more appropriately provide a cavity in the vortex water flow.

In the vortex water flow generator, shapes of the openings of the middle partition and the-other-end-side partition may gradually increase in size as far from the negative electrode. In this configuration, the shapes of the openings gradually increase as close to the injection side of the water plasma to form a conical shaped space inside the cylindrical portion. As a result, it is possible to stably provide a cavity in the vortex water flow. It is conceived that this is because the water easily flows toward the injection side of the water plasma.

In the vortex water flow generator, a plurality of middle partitions may be provided. In this configuration, it is possible to form the vortex water flow by dividing the inside of the cylindrical portion into a plurality of rooms.

The tapered surface may be curved to be recessed along a bowl-shaped surface.

In the vortex water flow generator, an arc-shaped beveled portion may be formed between the tapered surface and the inner circumferential surface of the opening. By curving the tapered surface in this manner, it is possible to suppress resistance to the vortex water flow and more appropriately provide a cavity in the vortex water flow.

In the vortex water flow generator, the cylindrical portion may have a channel for passing water from the outside to the inside thereof, each of the channel and the cylindrical portion may have a cylindrical inner circumferential surface, and the inner circumferential surface of the channel may linearly overlap with a tangential position of the cylindrical portion. In this configuration, it is possible to allow the water flowing from the channel to smoothly follow the cylindrical inner circumferential surface of the cylindrical portion. This contributes to stable formation of the vortex water flow.

In the vortex water flow generator, the channel may be formed between the neighboring partitions. In this configuration, it is possible to turn the water flow in the small space interposed between the partitions.

In the vortex water flow generator, a plurality of the channels may be formed along a circumferential direction of the cylindrical portion to be in an identical position in an extension direction of the center axis line. In this configuration, it is possible to stably form the vortex water flow by flowing water from a plurality of portions in the circumferential direction of the cylindrical portion corresponding to the positions of the channels.

In the vortex water flow generator, each of the partitions may be detachably installed in the cylindrical portion. In this configuration, it is possible to easily replace the partitions and facilitate maintenance, an adjustment work, and the like.

According to another aspect of the invention, there is provided a water plasma generator including: the vortex water flow generator; a chamber configured to house the vortex water flow generator; and a positive electrode and a negative electrode configured to generate arc discharge. The vortex water flow generator is placed between the negative electrode and the positive electrode to form a vortex water flow through which arc discharge generated between the negative and positive electrodes passes.

According to further another embodiment of the invention, there is provided a decomposition processor includes: the water plasma generator; and a supply device configured to supply a decomposition target object to the water plasma injected from the water plasma generator. The decomposition target object is decomposed by the water plasma.

In the decomposition processor, the supply device may have a nozzle for providing the decomposition target object from a tip, and the tip of the nozzle may be placed inside of the water plasma jet stream. In this configuration, it is possible to provide a decomposition target object into the water plasma jet stream and decompose the decomposition target object at a significantly high temperature. As a result, it is possible to improve reliability of decomposition of the decomposition target object and efficiently perform the decomposition.

In the decomposition processor, the tip of the nozzle may be placed in a space formed by extending the opening of the injection port along the center axis line.

In the decomposition processor, the tip of the nozzle may be placed in a space formed by extending the negative electrode along the center axis line.

In the decomposition processor, the tip of the nozzle may be placed to match or overlap with a center axis line position of the injection port. By, arranging the nozzle tip in this manner, it is possible to set a providing position of the decomposition target object to a higher temperature portion in the water plasma jet stream and more efficiently perform decomposition.

In the decomposition processor, the nozzle may have a cooling structure that flows a coolant to the inside of the tip, and the cooling structure may include: a first channel through which the decomposition target object passes; a second channel provided in an outer side of the first channel to pass the coolant from a basal end side of the nozzle to the tip side; and a third channel provided in an outer side of the second channel to communicate with the second channel in the tip side and pass the coolant from the tip side to the basal end side. In this configuration, it is possible to prevent damage of the nozzle by cooling the nozzle heated by the water plasma and stably provide the decomposition target object. In addition, it is possible to reliably cool the tip of the nozzle placed inside the water plasma and improve a cooling effect by cooling the entire nozzle.

The decomposition processor may further include: an exhaust gas disposer having a treatment space for disposing a gas generated by decomposing the decomposition, target object; a wall body that partitions the inside and the outside of the treatment space; and a cylindrical container configured to house the positive electrode and the injection port to discharge the gas to the treatment space. The nozzle may be supported by the container, and the container may have a thickness within which a space for flowing the coolant is formed. In this configuration, it is possible to dispose wastes gasified through the cylindrical body. In addition, it is possible to cool the container heated by the water plasma without exposing the coolant. Furthermore, it is possible to use the container as a jig of the nozzle and simplify the structure.

According to the invention, there is provided a decomposition processor mounted vehicle including the decomposition processor. The decomposition processor is mounted on a cargo box of a truck.

According to the invention, there is provided a decomposition method including: supplying the decomposition target object to the water plasma injected from the water plasma generator described above; and decomposing the decomposition target object.

According to the present invention, it is possible to stably provide a cavity in a vortex water flow by forming different sizes of opening shapes in a plurality of openings. In addition, it is possible to stabilize injection of the water plasma.

BRIEF DESCRIPTION OF DRAWINGS

FIG. 9 is an explanatory diagram illustrating positions of first and second nozzle tips;

FIG. 10 is a cross-sectional view illustrating internal structures of the first and second nozzles;

DESCRIPTION OF EMBODIMENTS

Embodiments of the invention will now be described in details with reference to the accompanying drawings. Note that each configuration of the embodiments is not limited to those described below, but may be appropriately changed or modified. In the following description, some parts of the configuration may be omitted for convenient description purposes.

Figure 1:
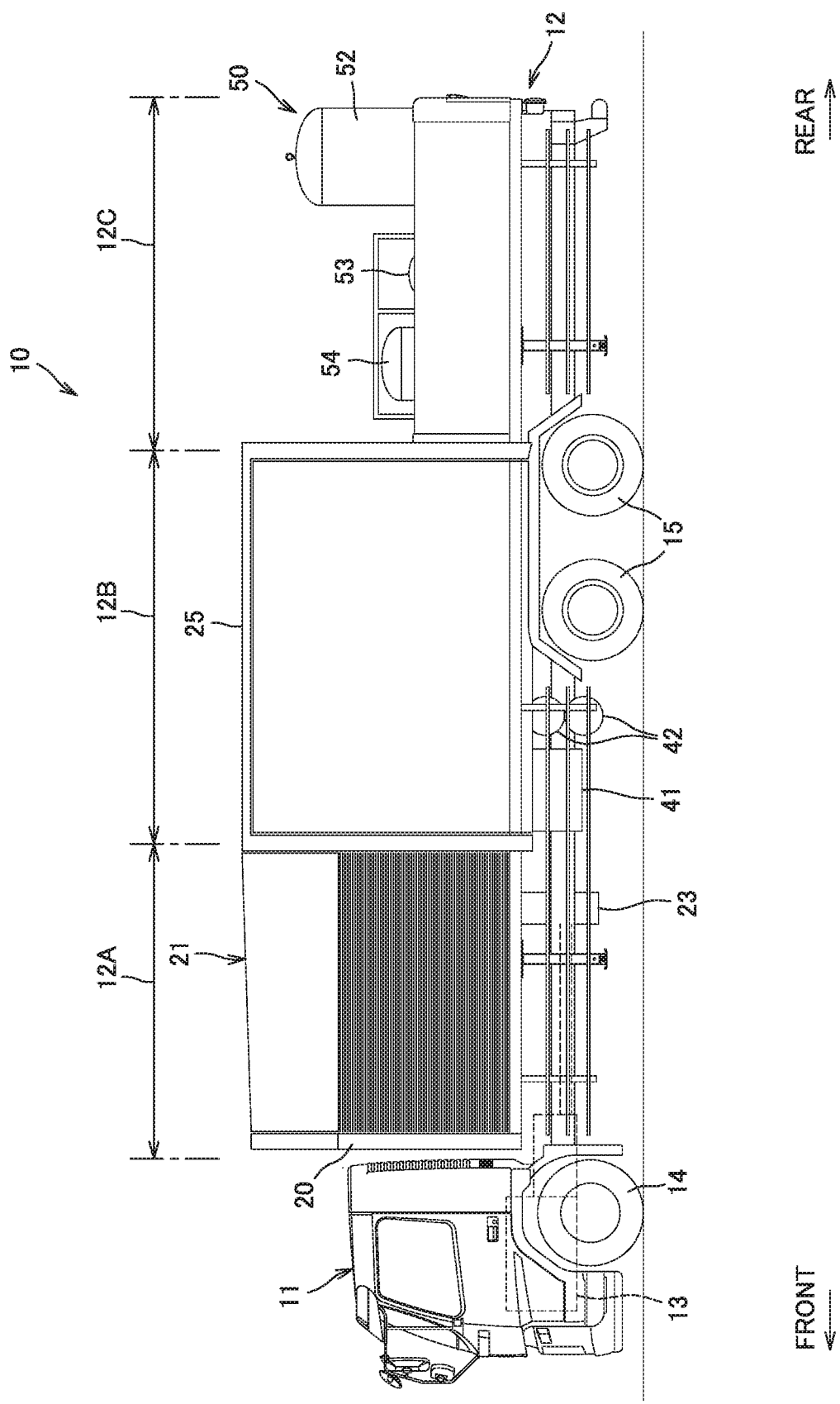
FIG. 1 is a side view illustrating a decomposition processor mounted vehicle according to an embodiment of the invention.

FIG. 1 is a side view illustrating a decomposition processor mounted vehicle according to an embodiment of the invention. In the following description, unless specified otherwise, "left", "right", "front", and "rear" refer to directions with respect to a vehicle, and directions indicated by arrows in each drawing are used as reference directions. Note that directions of each component in the following embodiments are merely for exemplary purposes and may be changed without a limitation.

As illustrated in FIG. 1, a decomposition processor mounted vehicle (hereinafter, referred to as a "vehicle") 10 has a truck-based structure. A cabin 11 is provided in a front side of the vehicle, and a cargo box 12 extending in the front-rear direction is provided in rear of the cabin 11. An engine 13 for driving front and rear wheels 14 and 15 is provided under the cabin 11. The cargo box 12 is partitioned into three areas along the front-rear direction. That is, an electric generation area 12A, a plasma treatment area 12B, and a work area 12C are provided sequentially from the front to the rear.

Figure 2:
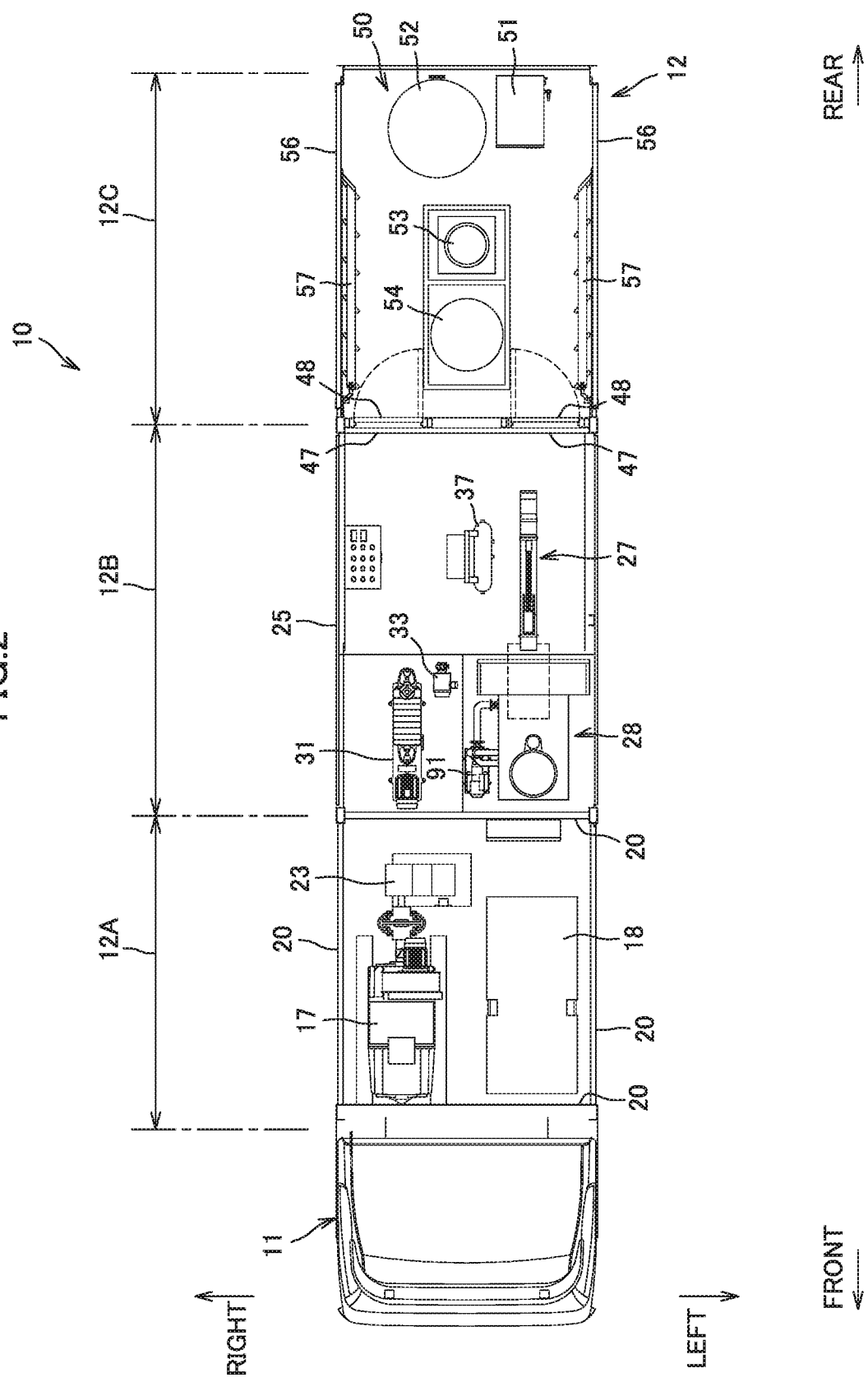
FIG. 2 is an inside plan-view illustrating the inside of a cargo box of the vehicle.

Subsequently, each part of the electric generation area 12A will be described. FIG. 2 is an inside plan-view illustrating the inside of a cargo box of the vehicle. As illustrated in FIG. 2, the vehicle 10 has a DC generator 17 and an AC generator 18 arranged side by side in the left and right sides of the electric generation area 12A. In the electric generation area 12A, the DC generator 17 and the AC generator 18 are enclosed by surrounding walls 20 in the front-rear and left-right directions. In addition, in the electric generation area 12A, an exhaust portion 21 (refer to FIG. 3) described below is provided over the DC generator 17 and the AC generator 18, so that the exhaust portion 21 and the surrounding walls 20 form a space for enclosing the electric generation area 12A during a vehicle travel or the like. The surrounding walls 20 provided in the left and right sides are opened or closed as a wing body type to allow the inside of the electric generation area 12A to be opened to the outside and expose the generators 17 and 18 to the outside. The AC generator 18 is mounted with an engine separate from the engine 13 of FIG. 1 to generate AC power using the power of the engine.

Figure 3:
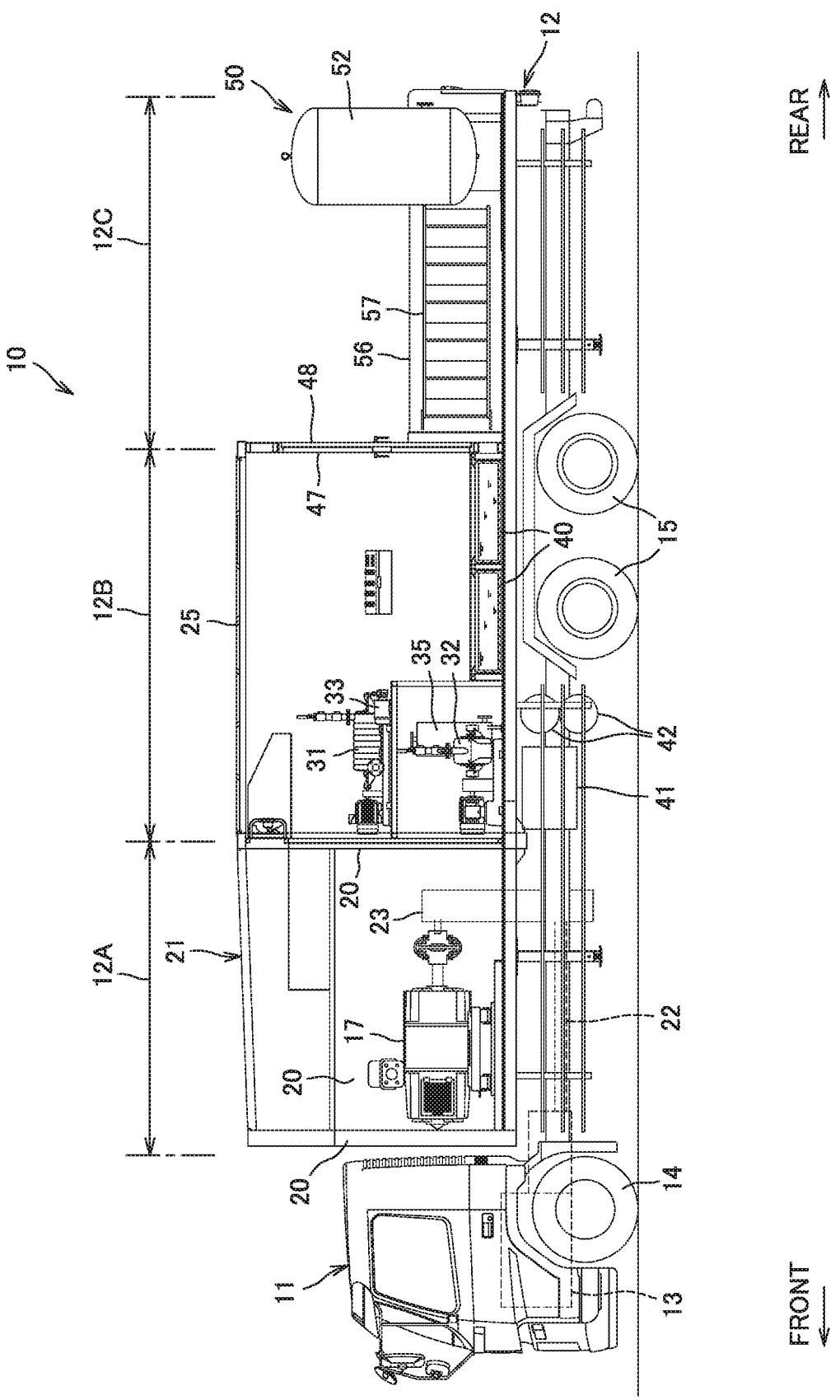
FIG. 3 is a left side inside-view illustrating the inside of the cargo box of the vehicle in the center position of the left-right direction.

FIG. 3 is a left side inside-view illustrating the inside of the cargo box of the vehicle in the center position of the left-right direction. The DC generator 17 generates electricity using the power of the engine 13. Specifically, as illustrated in FIG. 3, a propeller shaft 22 is rotated by driving the engine 13, and this rotation allows an input shaft of the DC generator 17 to rotate through a gear box 23 to generate DC power. By generating AC power and DC power in this manner, each component such as the water plasma generator described below can be operated even in a place where no power equipment is provided.

Figure 4:
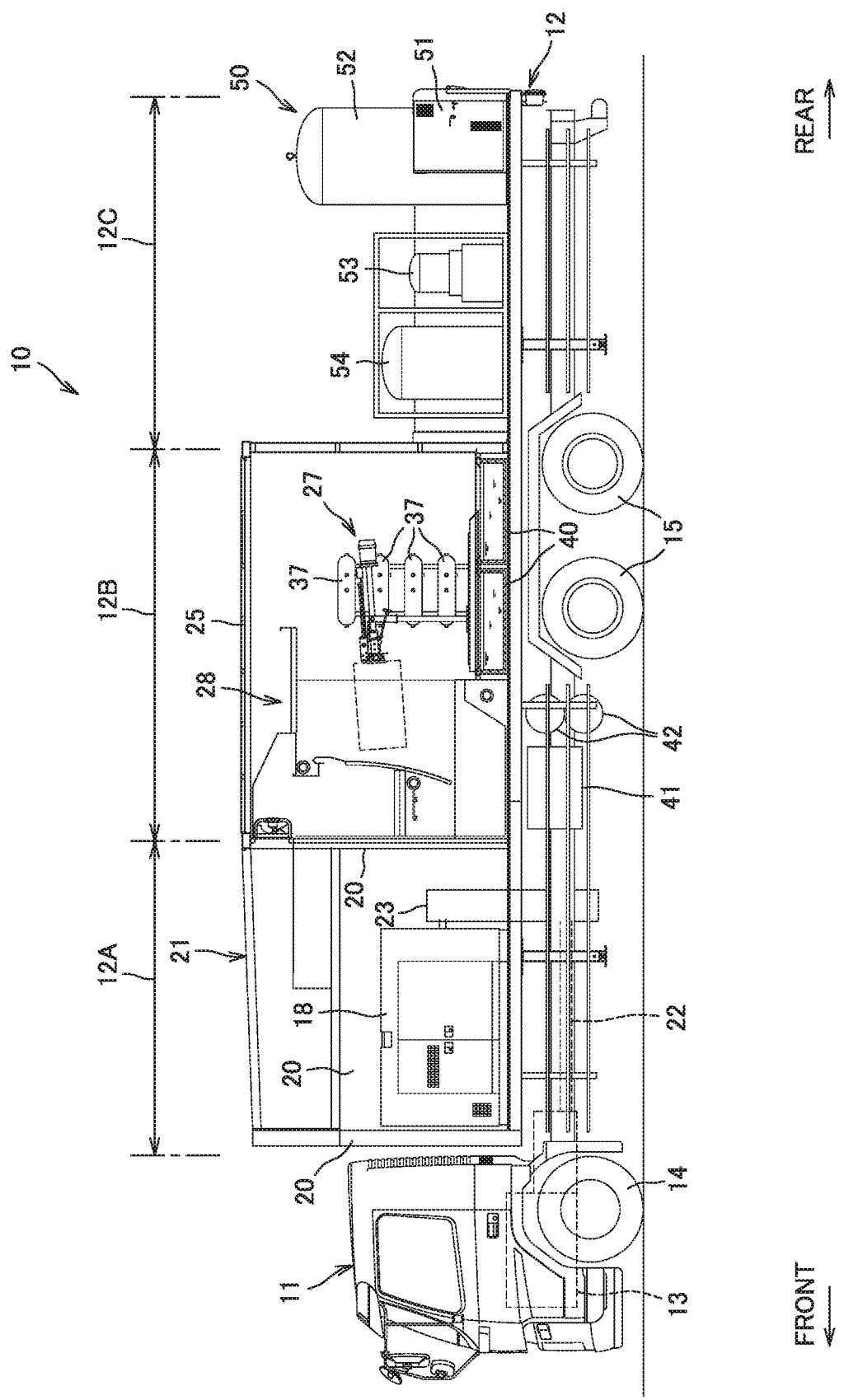
FIG. 4 is a left side inside-view illustrating the inside of the cargo box of the vehicle, seen from the left side of the vehicle.

Next, each part of the plasma treatment area 12B will be described. FIG. 4 is a left side inside-view illustrating the inside of the cargo box of the vehicle, seen from the left side of the vehicle. As illustrated in FIGS. 2 and 4, the vehicle 10 has a treatment room 25 which is an enclosed space in the plasma treatment area 12B. In addition, the vehicle 10 further has a water plasma generator 27 and an exhaust gas disposer 28 arranged side by side in the front and rear sides of the treatment room 25. The water plasma generator 27 is supplied with DC power from the DC generator 17 (not shown in FIG. 4) to generate DC arcs (arc discharge). By virtue of the DC arcs, the water supplied to the water plasma generator 27 is dissociated or ionized to inject a water plasma jet stream having high energy. The water plasma generator 27 will be described below in more details.

Hazardous wastes (decomposition target object) are provided to the water plasma jet stream injected from the water plasma generator 27 through a supply device described below. The water plasma jet stream is converted into a high-speed fluid having a significantly high temperature, so that hazardous substances of the hazardous wastes provided to this fluid are instantly decomposed to plasma and are then gasified.

The exhaust gas disposer 23 is provided in a downstream side of the water plasma injection from the water plasma generator 27, that is, in front of the water plasma generator 27. The exhaust gas disposer 28 performs treatment for molecules gasified by the water plasma, so that the oxidized gas is neutralized using strong alkaline water, and unharmful gases are discharged to the overlying exhaust portion 21 (not shown in FIG. 2). The exhaust portion 21 has a plurality of fans to discharge gases from the front side of the electric generation area 12A by using the upper part of the electric generation area 12A as an exhaust channel. The exhaust gas disposer 28 will be described below in more details.

Figure 5:
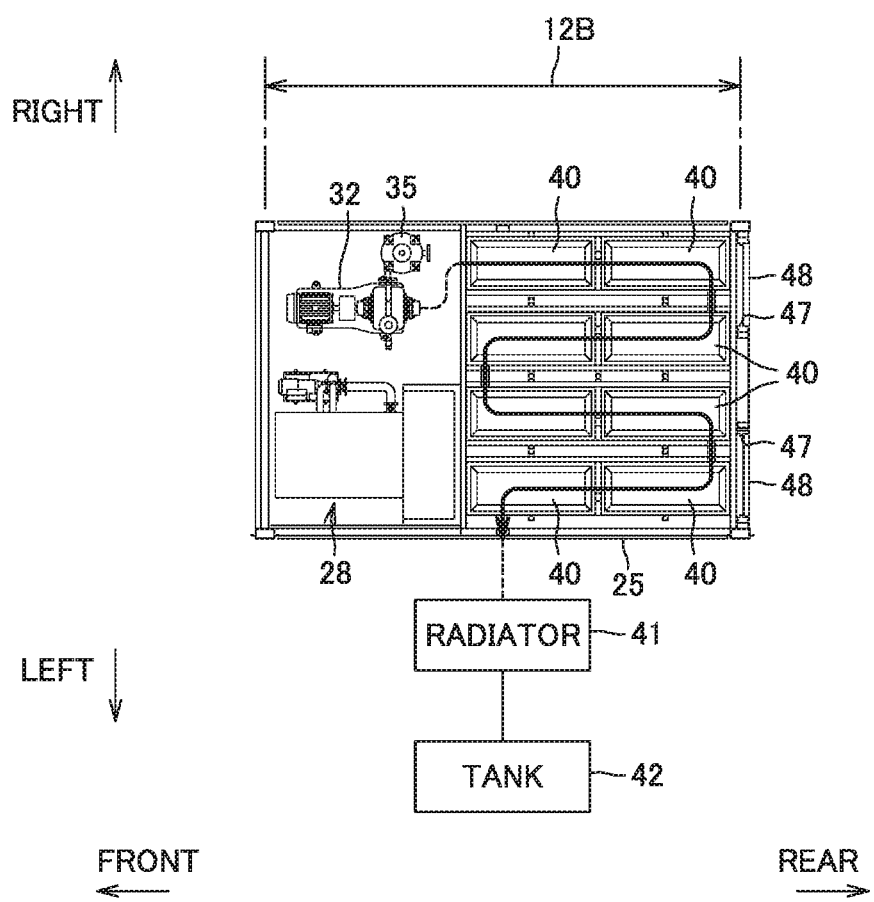
FIG. 5 is an inside plan-view illustrating the inside of a treatment room of the vehicle in the center position of the up-down direction.

FIG. 5 is an inside plan-view illustrating the inside of a treatment room of the vehicle in the center position of the up-down direction. As illustrated in FIGS. 2, 3, and 5, a supply pump 31 (not shown in FIG. 5) and a vacuum pump 32 (not shown in FIG. 2) are provided vertically in parallel in positions close to the front side of the treatment room 25. The supply pump 31 of the upper stage supplies a coolant and plasma water to the water plasma generator 27, and the plasma water is further fed by the high-pressure pump 33 (not shown in FIG. 5) as high-pressure water. The vacuum pump 32 sucks the coolant and the plasma water from the water plasma generator 27 to discharge the coolant and the plasma water. Since the vacuum pump 32 sucks a mixture of water and air, the mixture of water and air is fed to a gas-liquid separator 35 and is separated. Each of the pumps 31 to 33 and the gas-liquid separator 35 are driven by AC power supplied from the AC generator 18.

A passage of a pipe (not shown) for coupling each of the pumps 31 to 33 and the water plasma generator 27 is provided with a surge tank 37 as illustrated in FIGS. 2 and 4. A change of the water pressure (fluctuation) caused by each of the pumps 31 to 33 is suppressed by such a surge tank 37, so that the coolant and the plasma water can be supplied to and discharged from the water plasma generator 27 at a stable water pressure.

The coolant and the plasma water of the water plasma generator 27 are stored in the reservoir 40 illustrated in FIGS. 3 and 5 and are circulated and used by each of the pumps 31 to 33. Note that the same water is used as the coolant and the plasma water except that the water pressure is different when it is supplied to the water plasma generator 27. The water (including the coolant and the plasma water) sucked by the vacuum pump 32 and separated by the gas-liquid separator 35 flows into the reservoir 40. A double flooring structure is provided on a floor of a rear half of the treatment room 25, and the reservoir 40 is installed in the space formed by such a double flooring structure. The reservoir 40 has a total of eight cells including two cells in the front-rear direction by four cells in the left-right direction, and the water flows through each cell of the reservoir 40 in a meandering manner as indicated by the arrow of FIG. 5. Each cell of the reservoir 40 is coupled using a pipe or the like. In addition, the water flowing through all of cells of the reservoir 40 flows to a tank 42 through a radiator 41 placed below the cargo box 12 and in front of the rear wheels 15. In such a flow of the water, the water heated by the water plasma generator 27 is cooled, and is supplied to the water plasma generator 27 again through the supply pump 31.

Note that, since the water plasma generator 27 is placed over the reservoir 40 as illustrated in FIG. 4, sound generated from the water plasma generator 27 is attenuated by the water of the reservoir 40, so that a soundproof effect can be obtained.

As illustrated in FIG. 2, each of left and right entrance gates 47 is provided in a rear wall body of the treatment room 25, and doors 48 are provided to open or close the entrance gates 47. Therefore, an operator can access the treatment room 25 and the space of the cargo box 12 in the rear side of the treatment room 25 through the entrance gates 47.

Next, each part of the work area 12C will be described. As illustrated in FIGS. 2 and 4, the vehicle 10 further has a supply device 50 provided on the cargo box 12 in an opened space of the work area 12C. The supply device 50 includes a compressor 51, an air tank 52 that stores the air compressed by the compressor 51, a powder feeder 53 that feeds hazardous wastes powdered by the compressed air of the air tank 52, and a liquid feeder 54 that feeds liquid hazardous wastes using the compressed air of the air tank 52. The supply device 50 further has nozzles 110 and 111 (refer to FIG. 7) described below in the treatment room 25. The nozzles 110 and 111 are used to provide hazardous wastes fed from the powder feeder 53 and the liquid feeder 54 into the water plasma injected from the water plasma generator 27 through a pipe (not shown).

In the work area 12C, left and right side gate boards 56 are provided on the left and right sides, respectively, of the cargo box 12. The side gate board 56 is hinged to the cargo box 12 in the lower end portion to rotate between an upright position and a horizontal position. In the horizontal position, the side gate board 56 is coplanar with the cargo box 12 and forms a work space as a floor surface along with the cargo box 12 in the work area 12C. In the upright position, a ladder portion 57 (not shown in FIG. 4) is provided on the inner surface of each side gate board 56, and a front end of each ladder portion 57 is rotatably connected to a front end of the side gate board 56. Therefore, by rotating the side gate board 56 to the ground from the horizontal position such that the rear end of the ladder portion 57 is placed in the front side, an operator is allowed to easily move between the cargo box 12 and the ground by stepping on the ladder portion 57.

Figure 6:
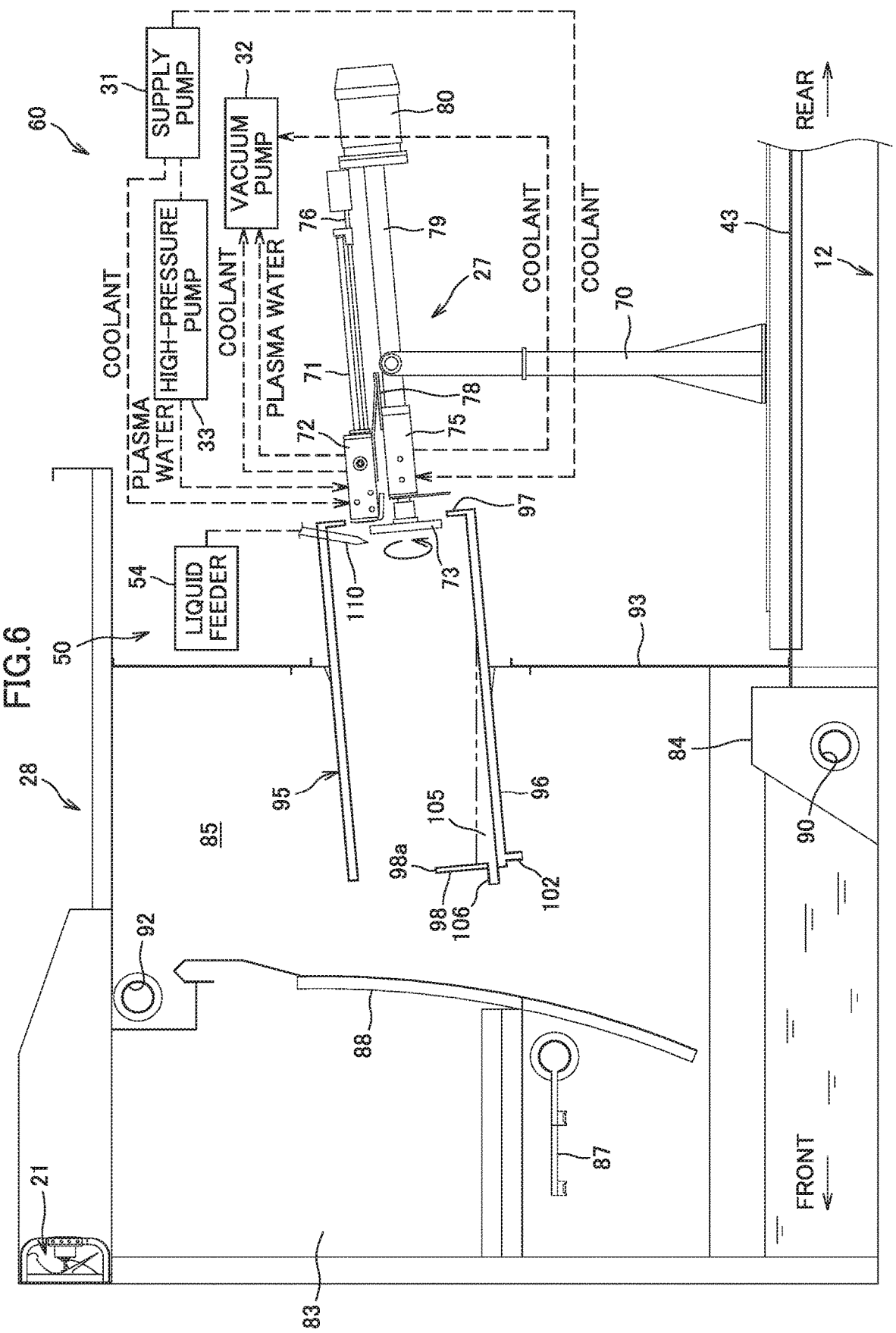
FIG. 6 is a partially cut-away view illustrating a decomposition processor according to an embodiment of the invention.

Here, as illustrated in FIG. 6, the water plasma generator 27, the exhaust gas disposer 28, and the supply device 50 described above constitute a decomposition processor 60 capable of decomposing hazardous wastes. Each part of the decomposition processor 60 according to an embodiment of the invention will now be described. FIG. 6 is a partially cut-away view illustrating the decomposition processor according to an embodiment of the invention.

The water plasma generator 27 is supported by a stand 70 at a predetermined height position. The water plasma generator 27 includes a negative electrode 71 extending in the front-rear direction, a chamber 72 into which a front end side of the negative electrode 71 is inserted, a disk-shaped positive electrode 73 formed of iron and placed obliquely downward in front of the chamber 72, and a positive electrode support 75 that supports the positive electrode 73.

The negative electrode 71 is a round bar formed of carbon and is displaced by a feed screw shaft mechanism 76 in the front-rear direction to adjust an insertion length to the chamber 72. The chamber 72 is supported by a support plate 78 overlying the positive electrode support 75. An extension cylinder 79 extending in the front-rear direction is coupled to the rear end of the positive electrode support 75, and a motor 80 is provided in the rear end of the extension cylinder 79. A driving force of the motor 80 is transmitted to the positive electrode 73 through the extension cylinder 79 and the positive electrode support 75 to rotate the positive electrode 73.

The chamber 72 is supplied with the coolant through the supply pump 31 and is supplied with the plasma water through the high-pressure pump 33. A part of the plasma water is injected from the front end side of the chamber 72 as water plasma. The coolant supplied to the chamber 72 and the plasma water not injected are sucked by the vacuum pump 32. Similarly, the positive electrode support 75 is supplied with the coolant flowing through the inside of the positive electrode 73 by the supply pump 31, and the coolant absorbing the heat of the positive electrode 73 is sucked by the vacuum pump 32.

In the cargo box 12, the exhaust gas disposer 28 includes a box-shaped casing 83 and a reservoir 84 provided under the casing 83 to store strong alkaline water by opening its upper part. The exhaust gas disposer 28 has a treatment space 85 for disposing gasified wastes over the reservoir 84 inside the casing 83. In addition, the exhaust gas disposer 28 further includes a shower device 87 and a panel body 88 provided inside the treatment space 85.

The reservoir 84 internally has a water intake 90, and the strong alkaline water of the reservoir 84 is supplied from the water intake 90 to the shower device 87 by operating the pump 91 (not shown) (refer to FIG. 2). The shower device 87 neutralizes the gasified acidic gas by injecting the supplied strong alkaline water to the treatment space 85. The neutralized molecules are discharged to the outside through the exhaust portion 21. In addition, the strong alkaline water of the reservoir 84 is also pumped up from the water intake 90 to the supply port 92 over the panel body 88, and the pumped strong alkaline water flows down to the reservoir 84 along the entire rear surface of the panel body 88. Such a flow of the strong alkaline water neutralizes the acidic gas as described above and absorbs the heat generated from the water plasma. Therefore, it is possible to obtain a cooling effect on the entire exhaust gas disposer 28.

The exhaust gas disposer 28 and the water plasma generator 27 are placed far from the wall body 93. The wall body 93 blocks the treatment space 85 of the exhaust gas disposer 28 from the rear side and partitions the inside of the treatment space 85 from the other space where the water plasma generator 27 is provided, so that air-tightness is maintained between both spaces.

Here, a cylindrical container 95 is penetratingly installed in the wall body 93, and the container 95 houses a front end side serving as an injection port side of the chamber 72 described below and the positive electrode 73. As a result, the water plasma jet stream injected from the water plasma generator 27 is covered by the container 95. A portion of the container 95 penetrating through the wall body 93 is entirely welded, and the container 95 is held by the wall body 93, so that the air-tightness is maintained between the container 95 and the wall body 93. The container 95 includes a cylinder body 96 formed in a cylindrical shape, a rear opening formation portion 97 provided in one end side (water plasma generator 27 side) of the cylinder body 96, and a front opening formation portion 98 provided in the other end side (exhaust gas disposer 28 side) of the cylinder body 96. An axial direction of the cylinder body 96 is slanted such that the exhaust gas disposer 28 side becomes lower than the water plasma generator 27 side.

Figure 7:
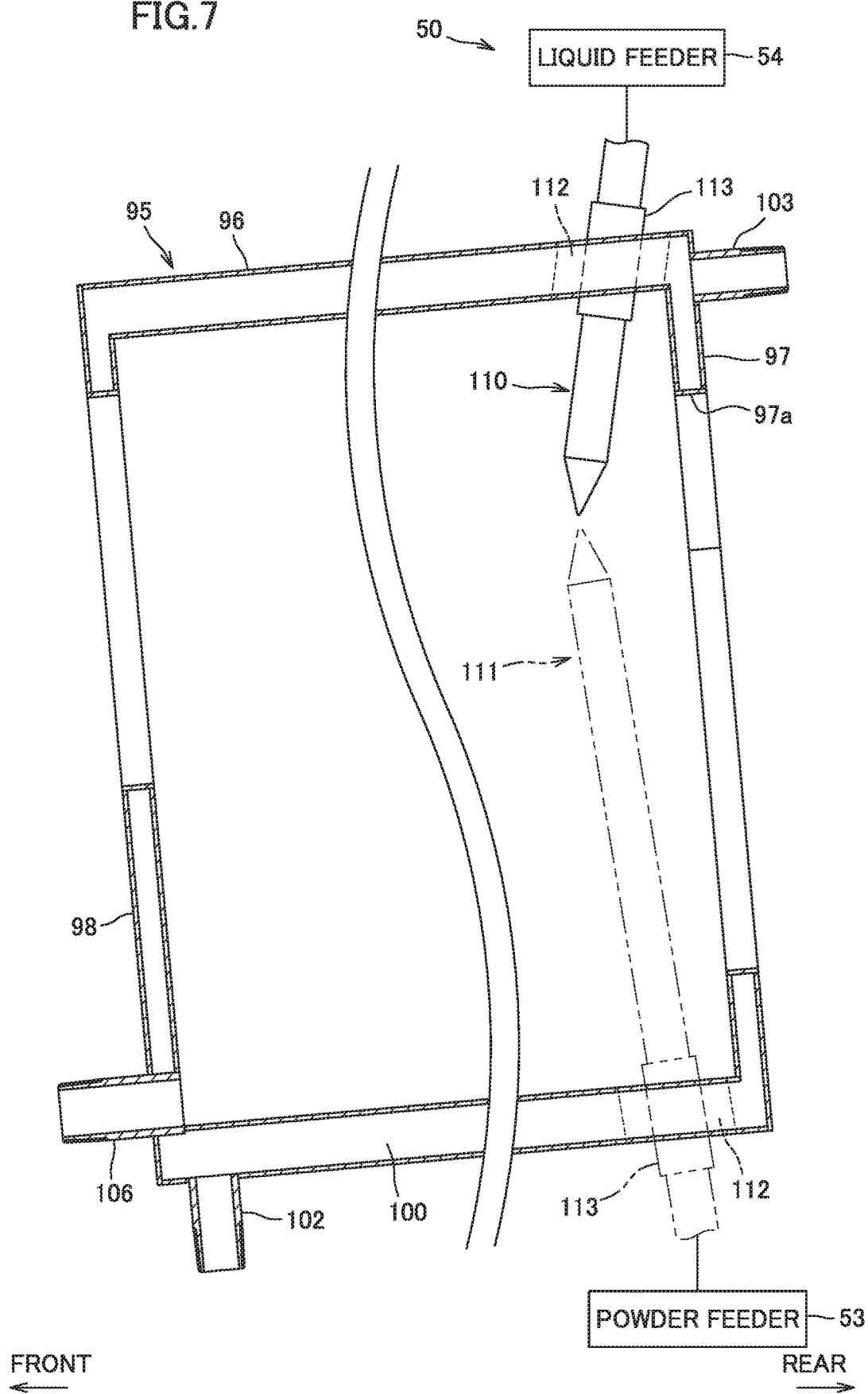
FIG. 7 is a cross-sectional side view illustrating a container.

FIG. 7 is a cross-sectional side view illustrating the container. As illustrated in FIG. 7, the cylinder body 96, the rear opening formation portion 97, and the front opening formation portion 98 of the container 95 have a doubled structure to form a single space 100 having a thickness within which the coolant flows. This space 100 communicates with a coolant supply passage 102 and a coolant discharge passage 103. The supply passage 102 is provided in a front lower end side of the cylinder body 96, and the discharge passage 103 is formed in an upper end side of the rear opening formation portion 97. The container 95 is supplied with the coolant from the supply passage 102 through a pump (not shown), and the coolant is introduced to the space 100. In addition, the coolant flowing through the space 100 from the supply passage 102 to the discharge passage 103 absorbs the heat generated from the water plasma. Therefore, it is possible to obtain a cooling effect of the container 95.

Figure 8A:
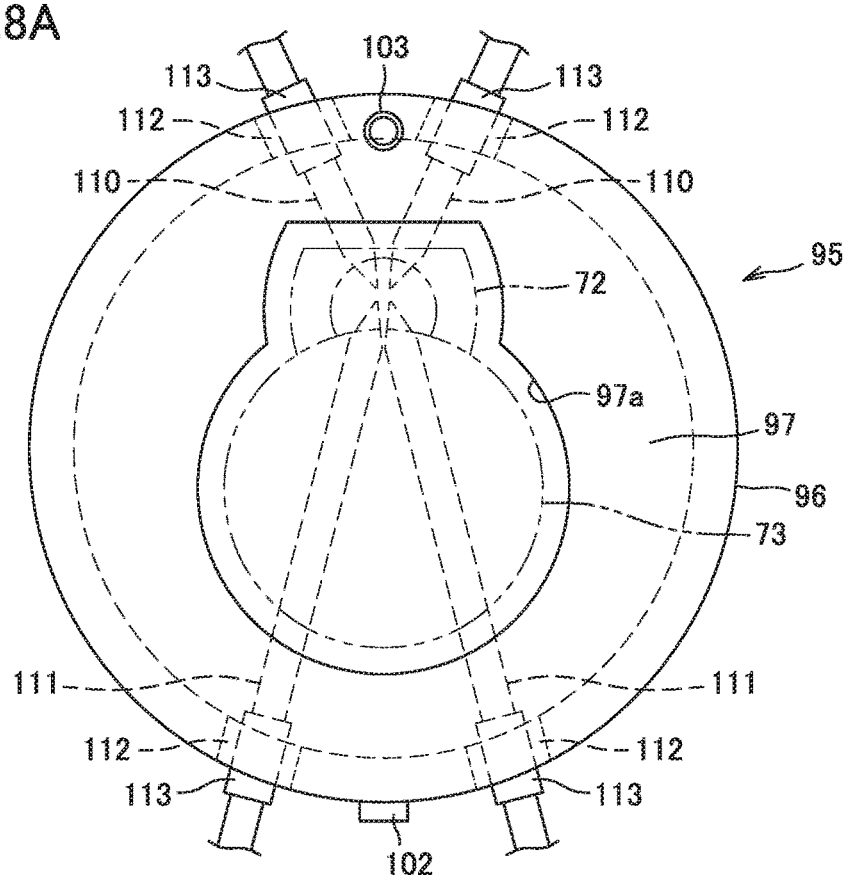
FIG. 8A is a rear view illustrating the container.
Figure 8B:
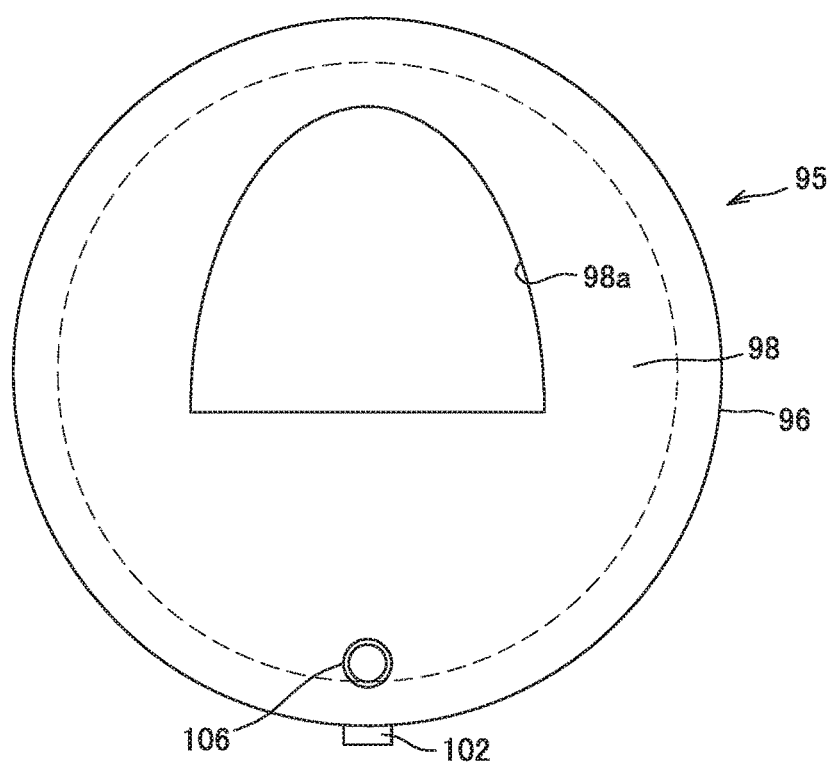
FIG. 8B is a front view illustrating the container.

FIG. 8A is a rear view illustrating the container, and FIG. 8B is a front view illustrating the container. As illustrated in FIG. 8A, an opening 97a of the rear opening formation portion 97 is formed in an opening shape matching the positive electrode 73 and the front end side of the chamber 72 to house the positive electrode 73 and the front end side of the chamber 72. As illustrated in FIG. 8B, an opening 98a of the front opening formation portion 98 is formed in an upper half of the front opening formation portion 98 and has a lower end portion extending in a horizontal direction. Therefore, as illustrated in FIG. 6, a storage space 105 is formed in a lower corner between the front opening formation portion 98 and cylinder body 96 inside the container 95. The storage space 105 stores hazardous wastes not decomposed by the water plasma, and the hazardous wastes are discharged through a channel 106 penetrating through a lower part of the front opening formation portion 98.

Returning to FIG. 7, the first nozzle 110 of the supply device 50 (refer to FIG. 4) is penetratingly supported by the container 95. According to an embodiment of the invention, the first nozzle 110 is installed in the upper part of the container 95, and has a tip directed downward. The first nozzle 110 is coupled to the liquid feeder 54, and liquid-phase hazardous wastes are fed from the liquid feeder 54 to the first nozzle 110 through a pipe or the like (not shown), so that the hazardous wastes can be provided from the tip of the first nozzle 110.

Here, the container 95 may penetratingly support the second nozzle 111. That is, the supply device 50 may have the second nozzle 111 in addition to the first nozzle 110 to allow the first and second nozzles 110 and 111 to be selectively used. According to an embodiment of the invention, the second nozzle 111 is installed in the lower part of the container 95 and has a tip directed upward. The second nozzle 111 is coupled to the powder feeder 53, and powdered hazardous wastes are fed from the powder feeder 53 to the second nozzle 111 through a pipe or the like (not shown), so that the hazardous wastes can be provided from the tip of the second nozzle 111. Note that the hazardous wastes discharged from the channel 106 through a circulation means (not shown) are also provided from the first and second nozzles 110 and 111 again.

A portion of the container 95 where each of the nozzles 110 and 111 penetrates is provided with a female thread 112, and an outer circumference of each of the nozzles 110 and 111 is provided with a male thread 113 fastenable to the female thread 112. Therefore, by fastening the male thread 113 to the female thread 112, each of the nozzles 110 and 111 is held by the container 95, and a position in the extension direction of each of the nozzles 110 and 111 can be adjusted by changing the fastening amount.

As illustrated in FIG. 8A, a pair of first nozzles 110 may be provided in two places of the left and right sides of the upper part of the container 95, and a pair of second nozzles 111 may be provided in two places of the left and right sides of the lower part of the container 95. In this case, female threads 112 are provided in two places of the upper and lower parts of the container 95, so that each tip position of the left and right nozzles 110 and 111 is aligned and adjusted by fastening the male threads 113 to the female threads 112.

Next, tip positions of the first and second nozzles 110 and 111 will be described below with reference to FIG. 9. FIG. 9 is an explanatory diagram illustrating tip positions of the first and second nozzles. Here, as illustrated in FIG. 9, in the water plasma generator 27, a water plasma jet stream J is injected from an injection port 145 corresponding to a cylindrical inner circumferential surface as described below. According to an embodiment of the invention, the water plasma jet stream J is injected from the injection port 145 in a conical shape widened to the front side, and the center axis line position C1 of the water plasma jet stream J is aligned with the center axis line position C1 of the injection port 145 to extend in the front-rear direction.

When hazardous wastes are provided, tip of each of the nozzles 110 and 111 is placed inside the water plasma jet stream J. Here, the water plasma jet stream J becomes an area that emits light by the injection. Advantageously, the opening of the injection port 145 are arranged such that the tip of each of the nozzles 110 and 111 is positioned in a space A1 extending along the center axis line position C1 of the injection port 145. In FIG. 9, the tip of each of the nozzles 110 and 111 is separated from the center axis line position C1. Alternatively, the tips of the nozzles 110 and 111 may be arranged to match or overlap with the center axis line position C1. Alternatively, the tip of each of the nozzles 110 and 111 may be arranged in a space A2 extending along the center axis line position C1 of the negative electrode 71. By setting the tip positions of the nozzles 110 and 111 in this manner, hazardous wastes can be provided to a portion of the water plasma jet stream J having a higher temperature. As a result, it is possible to efficiently decompose the provided hazardous wastes into gasified wastes and discharge the wastes to the treatment space 85 (refer to FIG. 6) of the exhaust gas disposer 28 through the container 51.

Subsequently, internal structures of the first and second nozzles 110 and 111 will be described with reference to FIG. 10. FIG. 10 is a cross-sectional view illustrating internal structures of the first and second nozzles. As illustrated in FIG. 10, the first nozzle 110 has a cooling structure 120 having a triple tube structure having first, second, and third channels 121, 122, and 123 formed sequentially from the inside to the outside. A basal end portion of the first nozzle 110 (upper end in FIG. 9) serves as a coupling portion 10a coupled to a pipe (not shown) communicating with the liquid feeder 54 (refer to FIG. 6). The coupling portion 110a communicates with the first channel 121. Therefore, the hazardous wastes fed from the liquid feeder 54 can be provided from the tip of the first nozzle 110 through the first channel 121.

The second channel 122 and the third channel 123 communicate with each other in the tip side of the first nozzle 110 to form a single space for flowing the coolant. This space communicates with the coolant supply passage 125 and the discharge passage 126. In the basal end side of the first nozzle 110, the supply passage 125 communicates with the second channel 122, and the discharge passage 126 communicates with the third channel 123. Specifically, the first nozzle 110 is supplied with the coolant from the supply passage 125 through a pump (not shown), and the coolant is introduced to the second channel 122. In addition, in the second channel 122, the coolant flowing from the basal end side of the first nozzle 110 to the tip side turns back at the tip and is introduced to the third channel 123. In the third channel 123, the coolant flows from the tip side of the first nozzle 110 to the basal end side and is discharged from the discharge passage 126. Using such a flow of the coolant, the heat generated from the water plasma is absorbed, and a cooling effect can be obtained across the entire length direction of the first nozzle 110.

Note that the first and second nozzles 110 and 111 are substantially vertically opposite to each other, but have the same structure. The first and second nozzles 110 and 111 are coupled to different parts, that is, the liquid feeder 54 and the powder feeder 53, respectively. Therefore, the structure of the second nozzle 111 will not be described.

Figure 11:
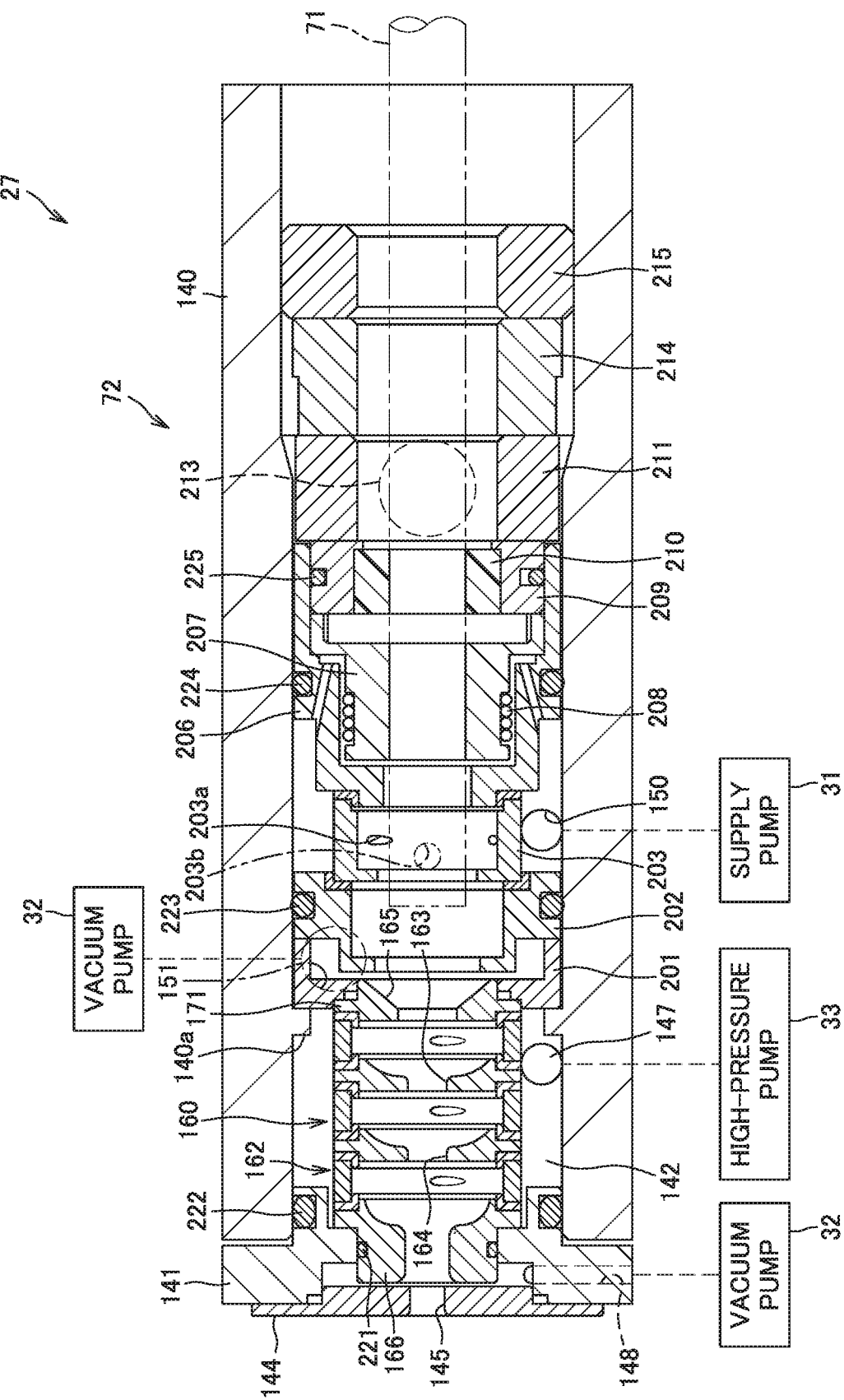
FIG. 11 is a side cross-sectional view illustrating a chamber.
Figure 12:
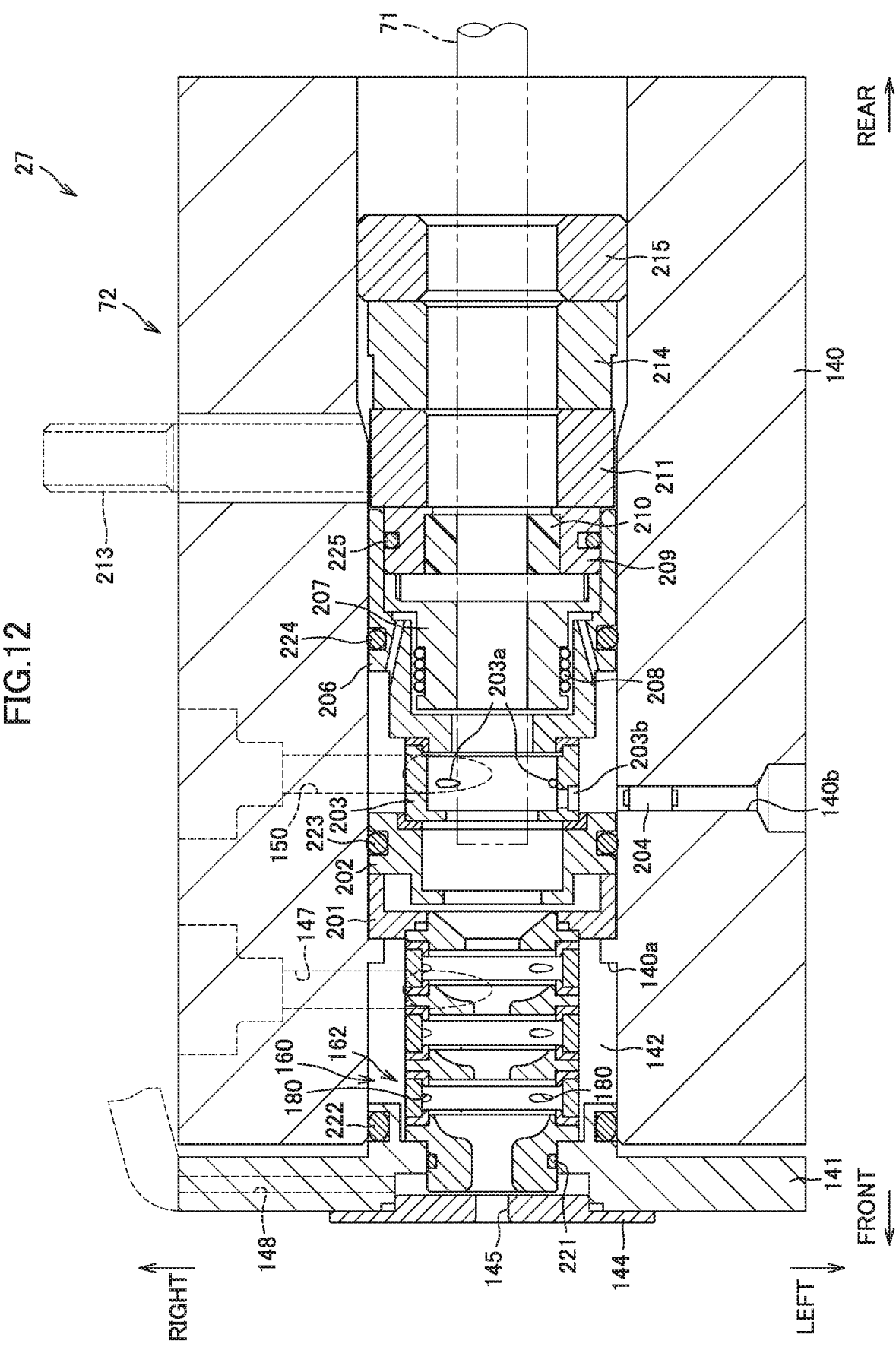
FIG. 12 is a plan cross-sectional view illustrating the chamber.
Figure 13:
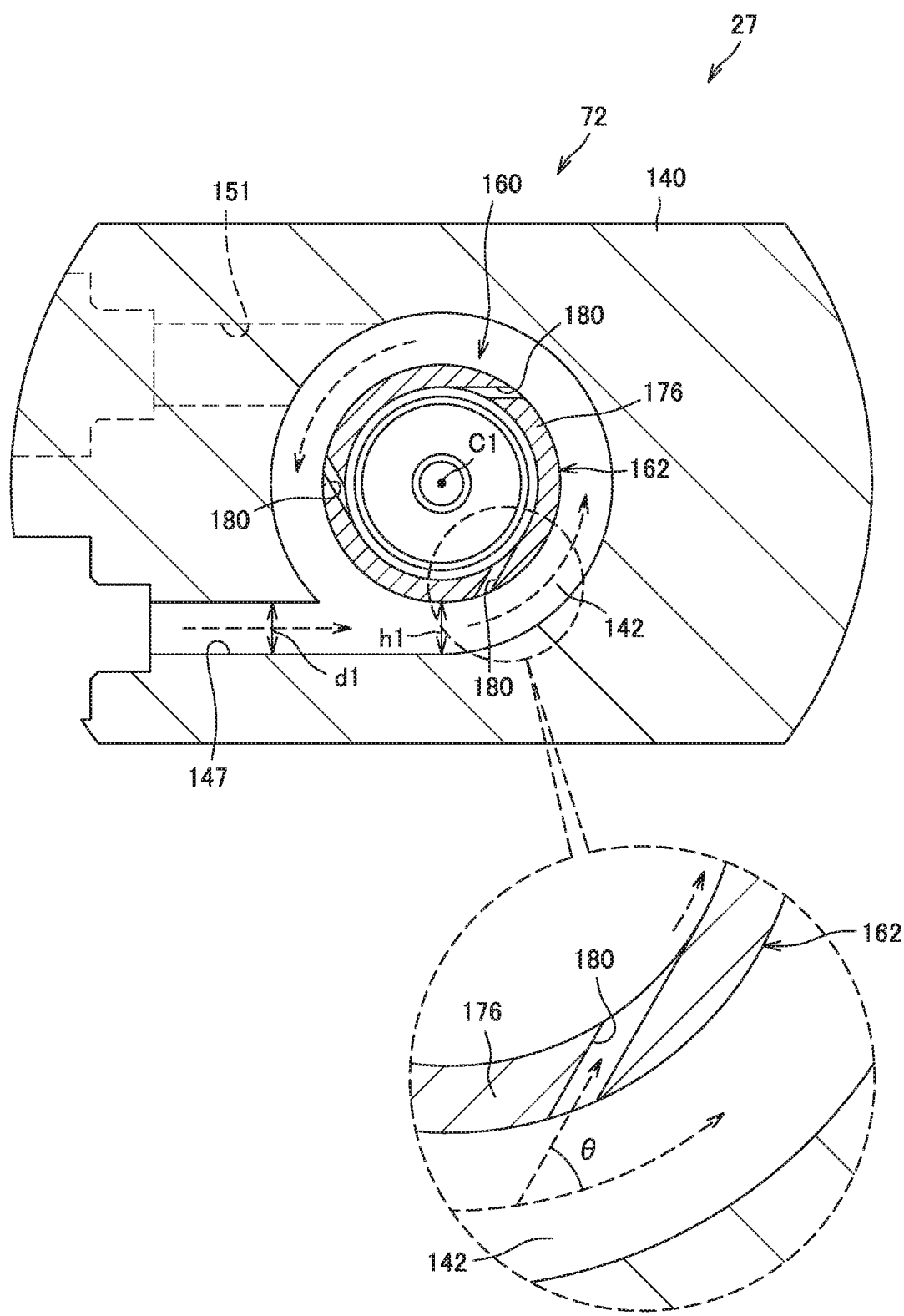
FIG. 13 is a longitudinal cross-sectional view illustrating the chamber.

Next, an internal structure of the chamber 72 will be described with reference to FIGS. 11 to 13. FIG. 11 is a side view illustrating the chamber FIG. 12 is a plan cross-sectional view illustrating the chamber. FIG. 13 is a longitudinal cross-sectional view illustrating the chamber.

As illustrated in FIGS. 11 and 12, the chamber 72 of the water plasma generator 27 has a chamber body 140 that forms a cylindrical inner circumferential surface extending in the front-rear direction and a front wall portion 141 installed in the front side of the chamber body 140, so that an inner space 142 for generating water plasma is formed in the chamber 72. The front wall portion 141 has an opening communicating with the inner space 142, and an injection port formation plate 144 is installed to block this opening from the front side. The injection port formation plate 144 has an injection port 145 for injecting water plasma.

A rib 140a extending in a circumferential direction in the vicinity of the front side is provided in the chamber body 140, and a plasma water supply passage 147 is provided in front of the rib 140a. In addition, a plasma water discharge passage 148 for discharging plasma water flowing to the opening is provided in the front wall portion 141. High-pressure plasma water is supplied from the high-pressure pump 33 to the plasma water supply passage 147, and the plasma water is sucked from the plasma water discharge passage 148 by virtue of the negative pressure of the vacuum pump 32.

In rear of the rib 140a of the chamber body 140, a coolant supply passage 150 and a coolant discharge passage 151 (not shown in FIG. 12) are provided. The coolant is supplied from the supply pump 31 to the coolant supply passage 150, and is sucked from the coolant discharge passage 151 by virtue of a negative pressure of the vacuum pump 32. The plasma water supply passage 147, the coolant supply passage 150, and the coolant discharge passage 151 are formed in a round hole shape corresponding to the cylindrical inner circumferential surface.

As illustrated in FIG. 13, the plasma water supply passage 147 communicates with the lower part of the inner space 142 having a circular shape as seen in a longitudinal cross-sectional view, and extends in the left-right direction. Specifically, the plasma water supply passage 147 extends in the lower tangential direction of the inner space 142. More specifically, the lower end of the plasma water supply passage 147 is positioned on a tangential line extending from the lower end of the inner space 142, As a result, the plasma water flowing from the plasma water supply passage 147 smoothly flows along a circumferential direction of the inner space 142.

Note that the plasma water supply passage 147 has an inner diameter d1 set to be substantially or nearly equal to a width h1 between the inner circumferential surface of the chamber body 140 that forms the inner space 142 and a cylindrical portion 162 described below. The longitudinal cross-sectional shape of the coolant supply passage 150 is similar to the longitudinal cross-sectional shape of the plasma water supply passage 147, so that the coolant as well as the plasma water can flow to the inner space 142. In addition, the coolant discharge passage 151 communicates with the upper part of the inner space 142 and extends in the left-right direction as seen in a longitudinal cross-sectional view.

The water plasma generator 27 has a substantially cylindrical vortex water flow generator 160 housed in the chamber 72. The vortex water flow generator 160 is arranged such that the inner space 142 is aligned with the center axis line position C1. Note that this center axis line position C1 is aligned with the center axis line position C1 of the injection port 145 described above (refer to FIG. 9). Therefore, as seen in a longitudinal cross-sectional view, the inner space 142 forms a circular space between the inner circumferential surface of the inner space 142 and the outer circumferential surface of the vortex water flow generator 160, and the plasma water flowing to the inner space 142 flows to turn in a circular space as described above.

Figure 14:
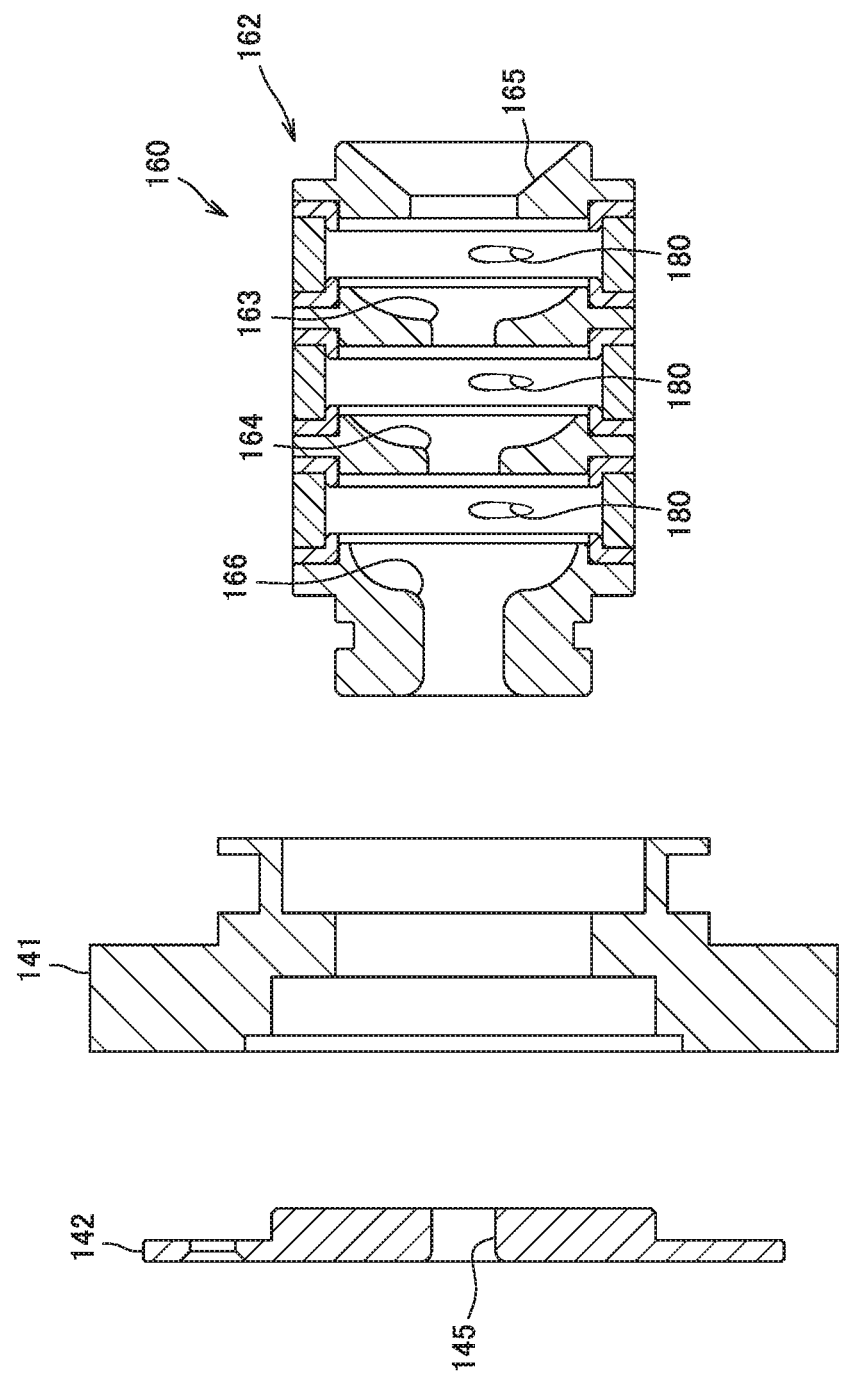
FIG. 14 is an exploded longitudinal cross-sectional view illustrating a part of the chamber and the vortex water flow generator.

FIG. 14 is an exploded longitudinal cross-sectional view illustrating a part of the chamber and the vortex water flow generator. As illustrated in FIG. 14, the vortex water flow generator 160 includes a cylindrical portion 162 that forms a cylindrical shape, first and second middle partitions 163 and 164 protruding from the inner circumference of the cylindrical portion 162, a rear partition (one-end-side partition) 165 provided in one end side (rear end side) of the cylindrical portion 162, and a front partition (the-other-end-side partition) 156 formed in the other end side (front end side) of the cylindrical portion 162. The first middle partition 163 is placed in rear of the second middle partition 164. The rear partition 165 is arranged to face the negative electrode 71 (refer to FIG. 11) placed in the rear side. A front end portion of the vortex water flow generator 160 is fitted to the opening of the front wall portion 141.

Figure 15:
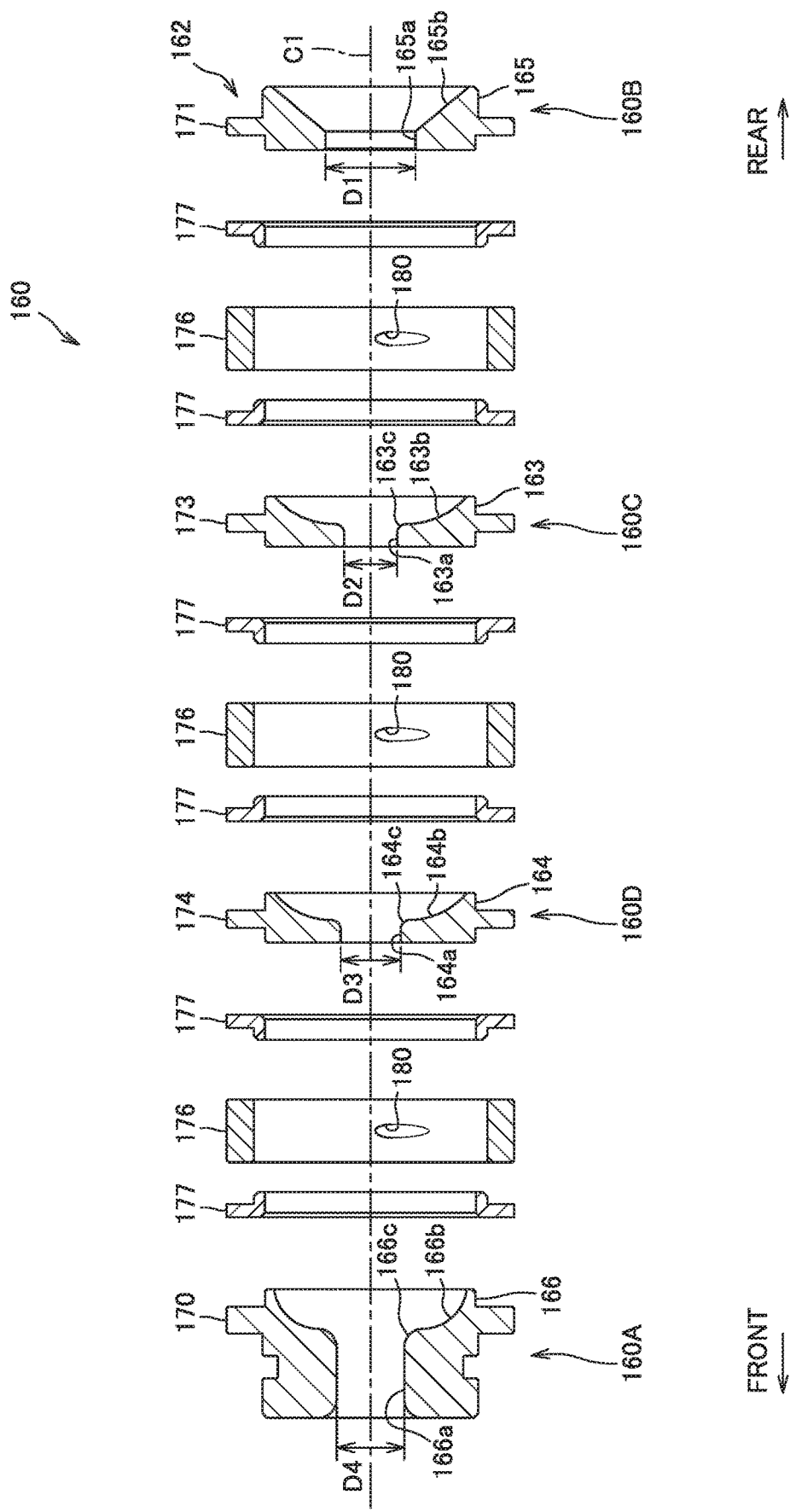
FIG. 15 is an exploded longitudinal cross-sectional view illustrating the vortex water flow generator.

FIG. 15 is an exploded longitudinal cross-sectional view illustrating the vortex water flow generator. As illustrated in FIG. 15, the cylindrical portion 162 is dividable into a plurality of pieces along an axial direction (front-rear direction). The cylindrical portion 162 includes a front end portion 170 positioned in the injection port 145 side (front side), a rear end portion 171 positioned in the side opposite to the front end portion 170 (rear side), first and second middle portions 173 and 174, three water flow generation rings 176, and six spacer rings 177 positioned between the front and rear end portions 170 and 171. The spacer rings 177 are provided on both front and rear sides of each of the three water flow generation rings 176, and the inner circumference of the spacer ring 177 protrudes forward or backward and is fitted to the inner circumference of the water flow generation ring 176. The first and second middle portions 173 and 174 are interposed between the water flow generation rings 176 from both the front and rear sides while nipping the spacer rings 177. In addition, out of the three water flow generation rings 176 arranged side by side in the front-rear direction, the front end portion 170 is provided in front of the frontmost water flow generation ring 176 while nipping the spacer ring 177, and the rear end portion 171 is provided in rear of the rearmost water flaw generation ring 176 while nipping the spacer ring 177.

Figure 16:
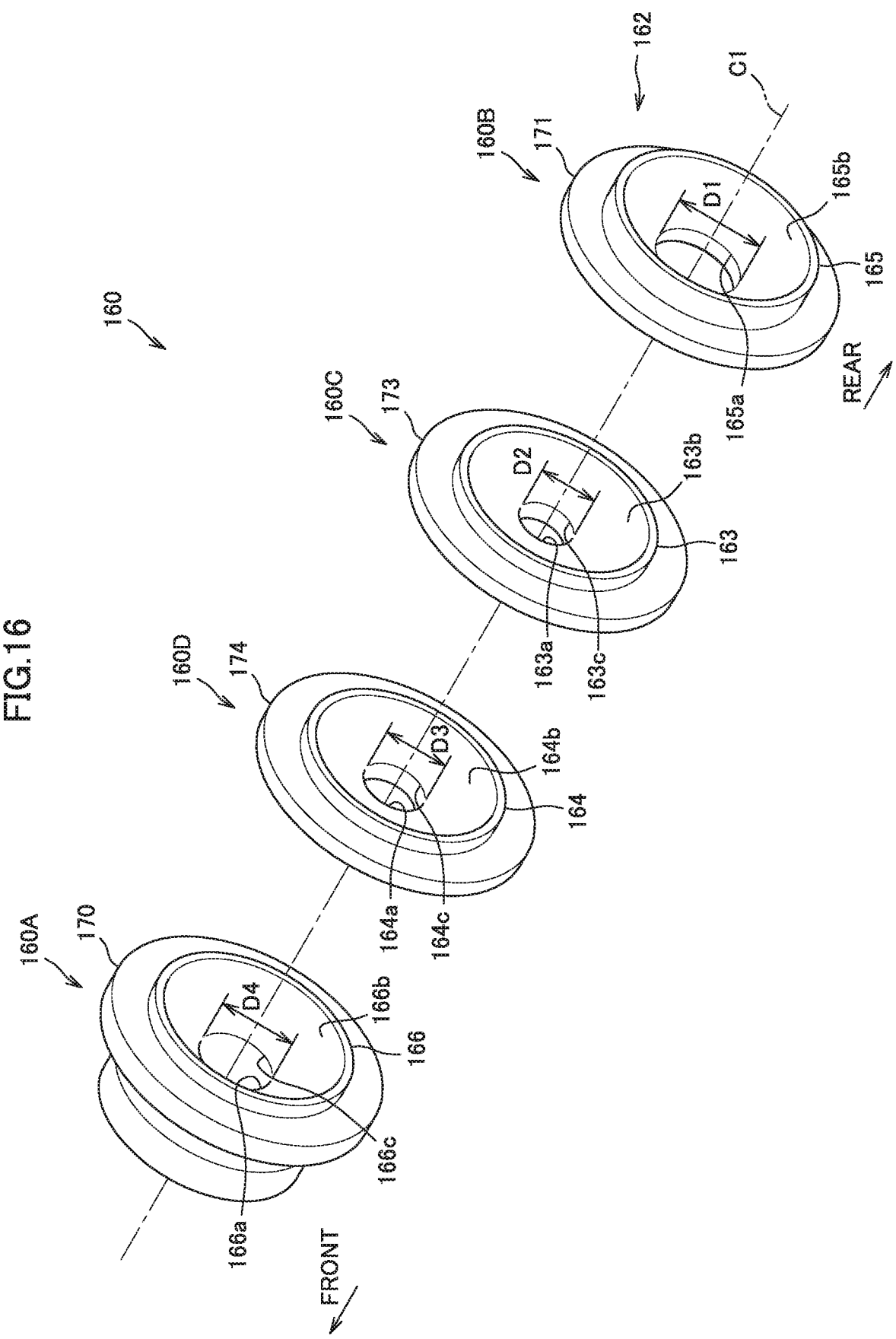
FIG. 16 is a partially exploded perspective view illustrating the vortex water flow generator.

FIG. 16 is a partially exploded perspective view illustrating the vortex water flow generator. As illustrated in FIGS. 15 and 16, the front end portion 170 is formed integrally with the outer circumference of the front partition 166 in a flange shape, and the rear end portion 171 is formed integrally with the outer circumference of the rear partition 165 in a flange shape. Therefore, the front end portion 170 and the front partition 166 constitute a head portion 160A as one component, and the rear end portion 171 and the rear partition 165 constitute a terminated portion 160B as one component. In addition, the first middle portion 173 is formed integrally with an outer side of the first middle partition 163 in a flange shape, and the second middle portion 174 is formed integrally with an outer side of the second middle partition 164 in a flange shape. Therefore, the first middle portion 173 and the first middle partition 163 constitute an annulus disk portion 160C as one component, and the second middle portion 174 and the second middle partition 164 constitute an annulus disk portion 160D as one component.

Partitions 163 to 166 have circular openings 163a to 166a, respectively, to include the center axis line position C1 of the cylindrical portion 162. According to an embodiment of the invention, center positions of the openings 163a to 166a are aligned with the center axis line position C1. Each of the openings 163a to 166a has a different opening shape in size. Specifically, the opening 165a of the rear partition 165 has the largest diameter D1, and the opening 163a of the first middle partition 163 has the smallest diameter D2. In addition, the diameters have a relationship D4>D3>D2, where "D3" denotes a diameter of the opening 164a of the second middle partition 164, and "D4" denotes a diameter of the opening 166a of the front partition 166. As a result, the opening sizes (opening shapes) increase from the opening 163a of the first middle partition 163 toward the front side (as far from the negative electrode 71 (refer to FIG. 11)) to form a conical shaped space.

The rear surfaces of the partitions 163 to 166 are formed as tapered surfaces 163b to 166b, respectively, narrowed forward as close to the center positions of the openings 163a to 166a, respectively (as far from the negative electrode 71 (refer to FIG. 11)). The tapered surfaces 163b, 164b, and 166b of the first middle partition 163, the second middle partition 164, and the front partition 166 are curved to form a bowl-shaped surface. Specifically, as seen in a cross-sectional view, the tapered surfaces 163b, 164b, and 166b are curved surfaces formed such that regions close to the openings 163a, 164a, and 166a are placed on a plane perpendicular to the center axis line position C1, and slopes become steep as going to the outside from the regions. The front surface of each of the partitions 163 to 166 is placed on a plane perpendicular to the center axis line position C1.

In the first middle partition 163, the second middle partition 164, and the front partition 166, arc-shaped beveled portions 163c, 164c, and 166c are formed between the openings 163a, 164a, and 166a and the tapered surfaces 163b, 164b, and 166b, respectively. The beveled portions 163c, 164c, and 166c have curvatures larger than curvatures of the tapered surfaces 163b, 164b, and 166b, respectively.

Here, as illustrated in FIGS. 13 and 15, each of the three water flow generation rings 176 includes a plurality of channels 180. According to an embodiment of the invention, three channels 180 are formed in a single water flow generation ring 176, and two channels 180 are not illustrated in FIG. 13. By forming the channels 180 in this manner, three channels 180 are formed in three positions of the water flow generation ring 176 along the extending direction of the center axis line position C1, and front and rear positions of the three channels 180 are aligned with each other. In addition, three channels 180 are formed in each gap between the partitions 163 and 166 neighboring in the front and rear sides. Each channel 180 is formed in a round hole shape having a cylindrical inner circumferential surface.

As illustrated in FIG. 13, the channels 180 are formed at equal angular intervals along a circumferential direction of the water flow generation ring 176 (at an interval of 120° in this embodiment). Each channel 180 penetrates through the water flow generation ring 176 to allow the inside and the outside to communicate with each other and extends in a direction sloped from a thickness direction. Specifically, each channel 180 extends in a tangential direction to the inner circumference of the water flow generation ring 176 in the communicating position. More specifically, each channel 180 is formed in a tangential position to the inner circumference of the water flow generation ring 176 to allow the inner circumferential surface of the channel 180 to linearly overlap. Therefore, there is no bulging portion between the innermost edge of the channel 180 and the inner circumference of the water flow generation ring 176. Furthermore, an angle θ between a flow direction of the plasma water from the outside to the inside of the channel 180 and a flow direction of the plasma water turning at the outside of the water flow generation ring 176 becomes an acute angle.

By forming the channel 180 in this manner, the plasma water flowing along the inner circumferential surface of the chamber body 140 in the outside of the cylindrical portion 162 flows to the inside of the cylindrical portion 162 through the channel 180. In addition, the plasma water flows smoothly along the inner circumferential surface of the cylindrical portion 162, so that a vortex water flow turning a circular shape is formed to provide a cavity in the center axis line position C1 as seen in a longitudinal cross-sectional view.

The water plasma generator 27 further has various components in rear of the vortex water flow generator 160 in the chamber 72. These components will now be described sequentially from the front side to the rear side.

As illustrated in FIG. 11, a cylindrical stopper 201 makes contact with a rear surface of the rib 140a of the chamber body 140. The rear partition 165 and the rear end portion 171 of the vortex water flow generator 160 are fitted to the opening of the stopper 201 to hold the position of the vortex water flow generator 160 not to move backward.

A stepped cylindrical casing 202 makes contact with the rear surface of the stopper 201, and a cylindrical water flow forming cylinder 203 is fitted to the rear surface of the casing 202. As illustrated in FIG. 12, the water flow forming cylinder 203 has a plurality of channels 203*a* shaped to match the channels 180 described above. By the channels 203*a*, the coolant supplied from the coolant supply passage 150 to the inner space 142 flows to the inside of the water flow forming cylinder 203 and makes contact with the negative electrode 71 to cool the negative electrode 71. The coolant subjected to the cooling is discharged from the coolant discharge passage 151 (not shown in FIG. 12).

Note that the coolant supplied from the coolant supply passage 150 flows to the vortex water flow generator 160 placed in front through the stopper 201 and the like and is also used as plasma water. In addition, the plasma water does not hinder cooling of the negative electrode 71 through the stopper 201 and the like. In short, the plasma water and the coolant mean main use purposes depending on differences in supply position and supply pressure, so that the common water is shared between the plasma water and the coolant available for both the use purposes.

A sensor hole 203*b* is formed in the left side of the water flow forming cylinder 203, and a sensor 204 (not shown in FIG. 11) is provided to face the sensor hole 203*b*. The sensor 204 is installed in a sensor installation hole 140*b* (not shown in FIG. 11) formed in the chamber body 140. The sensor 204 detects presence of the negative electrode 71 placed in the front or rear side of the sensor hole 203*b* through the sensor hole 203*b*. If the sensor 204 detects that there is no negative electrode 71, the detection data is output to a controller (not shown), and the feed screw shaft mechanism 76 (refer to FIG. 6) is driven to move the negative electrode 71 forward by a predetermined length. As a result, a front end position of the negative electrode 71 can be maintained within a predetermined range in front of the sensor hole 203*b*.

A stepped cylindrical casing 206 internally having a step is provided in rear of the water flow forming cylinder 203. A front end portion of the casing 206 is fitted to the rear end side of the water flow forming cylinder 203. A contactor 207 that makes contact with and holds the negative electrode 71 is provided inside the casing 206. The contactor 207 is divided into several pieces on a predetermined angle basis in a circumferential direction although not shown in the drawing. In addition, the inner diameter of the contactor 207 is variable. Furthermore, a ring-shaped elastic body 208 is provided on the outer circumference of the contactor 207 such that a contact state between the negative electrode 71 and the contactor 207 is maintained by tightly fastening the negative electrode 71 while interposing the contactor 207 by virtue of an elastic force of the elastic body 208.

The ring-shaped seal holder 209 makes contact with the rear end surface of the contactor 207, and a seal 210 is provided in a seal holder 209. The seal 210 maintains liquid tightness with the negative electrode 71 to restrict leaking of the coolant to the rear side of the seal 210.

The ring-shaped connector 211 makes contact with the rear end surface of the seal holder 209, and a wire 213 is connected to the connector 211 through an adapter and the like (not shown). The wire 213 is supplied with DC power from the DC generator 17 (refer to FIG. 2) through a switch board and the like. The connector 211, the seal holder 209, and the contactor 207 are formed of a conductive material, and the negative electrode 71 and the wire 213 are electrically connected through the connector 211, the seal holder 209, and the contactor 207. As a result, DC power for generating arc discharge is supplied to the negative electrode 71.

The ring-shaped spacer 214 makes contact with a rear end surface of the connector 211, and a stop screw 215 penetrating through the negative electrode 71 makes contact with a rear end surface of the spacer 214. A female thread (not shown) fastenable to the stop screw 215 is formed on the inner circumferential surface in rear of the chamber body 140. By fastening the stop screw 215 forward, each component in rear of the vortex water flow generator 160 described above is positioned in the front-rear direction.

Note that the components 221 to 225 of the chamber 72 are seal members such as an O-ring for maintaining liquid tightness on such a contact surface.

Next, a vortex water flow in the vortex water flow generator 160 will be described. As illustrated in FIG. 13, as high-pressure plasma water is supplied from the plasma water supply passage 147, the plasma water flows to turn in a cylindrical space provided between the inner circumferential surface of the chamber body 140 that forms the inner space 142 and the outer circumferential surface of the vortex water flow generator 160. By virtue of the turning flow of the plasma water, the plasma water flows to the inside of the cylindrical portion 162 through the channel 180. In this case, the inner circumferential surface of the channel 180 linearly overlaps with a tangential position on the inner circumference of the water flow generation ring 176. Therefore, the plasma water flows smoothly along the inner circumferential surface of the cylindrical portion 162.

Figure 17:
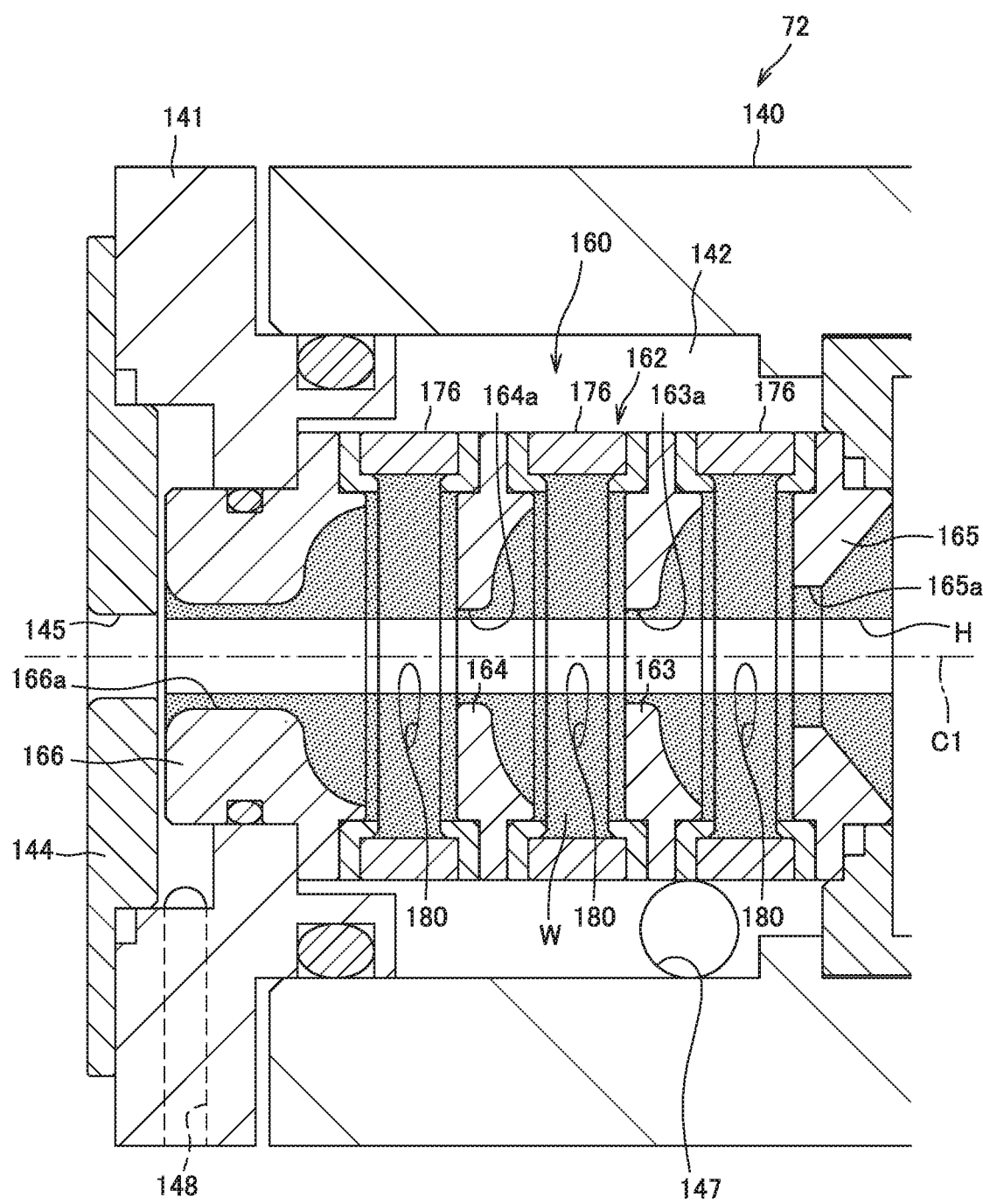
FIG. 17 is a diagram for describing a vortex water flow lay partially enlarging FIG. 11.

FIG. 17 is a diagram for describing a vortex water flow by enlarging some parts of FIG. 11. As illustrated in FIG. 17, the plasma water flowing from the channels 180 to the inside of the cylindrical portion 162 flows to turn between the partitions 163 to 165 neighboring in the front-rear direction. In this case, the turning plasma water is sucked from the plasma water discharge passage 148 provided in the front wall portion 141. For this reason, the plasma water flows to the front side through the openings 163*a*, 164*a*, and 166*a*, passes through a gap between the front end of the front partition 166 and the injection port formation plate 144, and is discharged from the plasma water discharge passage 148. In this case, the turning vortex water flow W is formed to provide a cavity H in the center axis line position C1. Here, if the cavity H is not provided in the vortex water flow W, no arc discharge AR (refer to FIG. 18) is generated between the positive electrode 73 and the negative electrode 71. Therefore, it is important to form the vortex water flow W to stably generate the cavity H.

In this regard, the inventors made experiments over and over under various conditions and found a fact that the cavity H of the vortex water flow W is most stably provided when a relationship D4>D3>D2 is established between the diameters D2 to D4 of the openings 163*a*, 164*a*, and 166*a* as illustrated in FIGS. 14 and 16. It is conceived that, since the opening diameters D2 to D4 increase toward the front side in a conical shaped space, the plasma water easily flows from the rear side to the front side as close to the downstream side (close to the front side). Note that, besides the aforementioned relationship, the cavity H is stably provided by forming the opening diameters D1 to D4 in different sizes. In this case, at least one of the openings 163*a* to 166*a* may have a different size of the diameter from the other opening diameters. By forming the openings 163*a*, 164*a*, and 166*a* in different sizes, it is possible to improve freedom of adjustment for the amount of plasma water flowing through each of the opening 163a, 164a, and 166a. As a result, it is possible to employ various opening diameters to appropriately provide the cavity H in the vortex water flow W and stably inject the water plasma.

By curving the tapered surfaces 163b, 164b, and 166b to form a bowl-shaped surface or forming the arc-shaped beveled portions 163c, 164c, and 166c, it is possible to suppress a turbulence that hinders formation of the vortex water flow W. This contributes to stable formation of the cavity H. Note that the plasma water also has an effect of cooling the vortex water flow generator 160 or the chamber body 140 by virtue of the turning flow.

Figure 18:
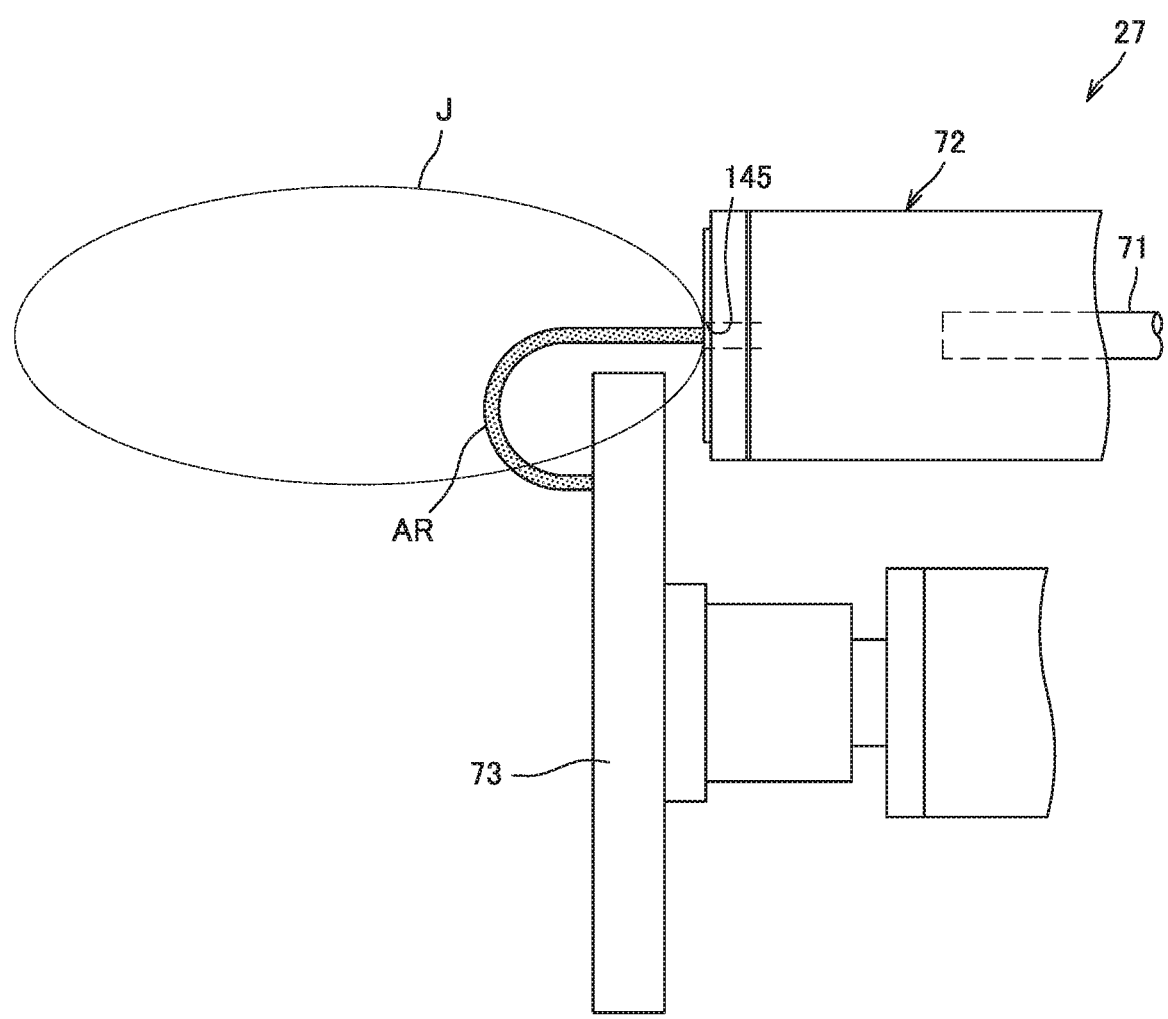
FIG. 18 is an explanatory diagram illustrating generation states of arc discharge and water plasma.

As DC power is supplied to the positive electrode 73 and the negative electrode 71 as illustrated in FIG. 18 while the vortex water flow W is provided with the cavity H, arc discharge AR is generated between the positive electrode 73 and the negative electrode 71. In this case, the arc discharge AR is generated through the cavity H of the vortex water flow W. As the arc discharge AR is generated, the plasma water of the vortex water flow W is dissociated or ionized, and a water plasma jet stream J having high energy is injected from the injection port 145.

The water plasma jet stream J is converted into a high-speed fluid having a significantly high temperature, and the hazardous wastes provided from the tip of each of the nozzles 110 and 111 are decomposed as illustrated in FIG. 9. Since the tip of each of the nozzles 110 and 111 is arranged in the positions described in conjunction with FIG. 9 according to an embodiment of the invention, the decomposition can be performed under the better condition in a part having a higher temperature in the water plasma jet stream J. Therefore, it is possible to efficiently decompose the provided hazardous wastes into gasified wastes. Here, the hazardous wastes may include PCB, sulfuric acid pitches, asbestos, freon, halon, tires, various types of garbage, and the like. As illustrated in FIG. 7, from the nozzles 110 and 111, liquid wastes are provided through the liquid feeder 54, and granulated or powdered wastes are provided through the powder feeder 53. Even when such hazardous wastes are provided, it is possible to decompose the hazardous wastes into unharmful wastes.

The container 95 is heated during the decomposition of hazardous wastes. However, the container 95 can be cooled and used by passing the coolant within a thickness of the container 95. In addition, since each of the nozzles 110 and 111, especially their tips are positioned in the middle of the water plasma jet stream J, the nozzles 110 and 111 are heated with high energy. However, using the cooling structure 120 described above in conjunction with FIG. 10, it is possible to suppress damage that may be caused by the heating.

The acidic gas gasified by the water plasma jet stream J is neutralized by the exhaust gas disposer 28 described above in conjunction with FIG. 6. Therefore, it is possible to convert the gas treated by the water plasma into the safer exhaust gas. In addition, the unharmful gas can be discharged from the exhaust portion 21 placed in the upper part.

According to the aforementioned embodiment, the hazardous wastes described above can be disposed on the vehicle 10. Therefore, it is possible to operate the water plasma generator 27 in a mobile manner and dispose hazardous wastes unsuitable for delivery in a field where the wastes are stored. As a result, it is possible to reduce cost for moving and disposing hazardous wastes and to dispose a large amount of hazardous wastes to reduce cost for disposal.

However, in Patent Document 1 described above, the water plasma jet stream is discharged from the water plasma burner, and the water plasma jet stream is discharged in a shape widening from the injection port of the water plasma burner as far from the injection port within a predetermined range. In the technique of Patent Document 1, a supply means for supplying incinerated ashes from the upper side of the water plasma jet stream is provided far from the injection port of the water plasma burner by a predetermined distance.

In the apparatus of Patent Document 1, a tip (lower end) of the supply means serving as a supply port is arranged over the water plasma jet stream. A temperature of the water plasma jet stream decreases as far from the injection port, and decomposition performance for incinerated ashes also decreases. Therefore, there is a demand for improvement of the decomposition performance, in view of such a demand, in order to improve efficiency of the decomposition process based on water plasma, the aforementioned configuration is provided. That is, the supply device 50 has the nozzles 110 and 111 for providing hazardous wastes (decomposition target object) from the tip, and the tips of the nozzles 110 and 111 are placed inside of the water plasma jet stream. Using such a configuration, it is possible to provide the decomposition target object into the inside of the water plasma jet stream and decompose the decomposition target object at a significantly high temperature. As a result, it is possible to improve decomposition reliability for the decomposition target object and efficiently perform the decomposition.

Note that the present invention encompasses various modes without limiting to the aforementioned embodiments. In the aforementioned embodiments, sizes, shapes, or directions illustrated in the attached drawings may be appropriately changed without a limitation as long as the effect of the present invention can be exhibited. Besides, various modifications or changes may be possible within the spirit and scope of the present invention.

For example, although the middle partition includes a pair of the first and second middle partitions 163 and 164 in the aforementioned embodiments, the number of middle partitions may be three or more, or singular as long as the vortex water flow W can be formed as described above.

Although the vortex water flow generator 160 can be divided into a plurality of members as illustrated in FIG. 15, the members neighboring in the front-rear direction may be integrated without a limitation. For example, in the head portion 160A, the spacer ring 177 and the water flow generation ring 176 placed in the rear may be integrated with each other. Besides, various structures may also be employed as long as they can be formed.

The shapes of the openings 163a to 166a are not limited to a circular shape. The shape of the opening may be changed to an oval shape, a polygonal shape, and the like as long as the vortex water flow W can be generated as described above.

The position of the channel 180 in the circumferential direction of the water flow generation ring 176 is not particularly limited. Although the positions of the channels 180 are aligned across of the water flow generation rings 176 in FIG. 15, the position of the channel 180 may be changed in each water flow generation ring 176.

The position or direction of each nozzle 110 or 111 may also be changed as long as the nozzles 110 and 111 are placed in the tip positions described in the aforementioned embodiments.

The target object decomposed and disposed by the water plasma generator 27 is not limited to the aforementioned hazardous wastes. An unharmful object may also be used as a decomposition target object. In addition, the water plasma generator 27 may be used in any process based on water plasma such as a thermal spray without limiting to the waste disposal.

According to the present invention, it is possible to stably inject a water plasma jet stream from the water plasma generator.

This application is based on and claims priority to Japanese Patent Application Laid-open No. 2016-519, filed on Jan. 5, 2016, and Japanese Patent Application Laid-open No. 2016-527, filed on Jan. 5, 2016, the entire content of which is incorporated herein by reference.

The invention claimed is:

1. A vortex water flow generator placed between a negative electrode and a positive electrode of a water plasma generator that injects a water plasma, the water plasma becoming a jet stream by dissociating or ionizing water to form a vortex water flow having a cavity for passing are discharge generated between the negative and positive electrodes, the vortex water flow generator comprising:
a cylindrical portion configured to form the vortex water flow along an inner circumference;
a middle partition protruding from the inner circumference of the cylindrical portion;
a one-end-side partition disposed in one end side of the cylindrical portion to face the negative electrode; and
the-other-end-side partition disposed in the other end side of the cylindrical portion,
wherein each of the partitions has an opening in a position including a center axis line of the cylindrical portion, the openings having different opening shapes in size,
the middle partition and the-other-end-side partition have surfaces at the negative electrode side, the surfaces being formed by tapered surfaces gradually receding from the negative electrode as close to the center axis line, and
an arc-shaped beveled portion is formed between the tapered surface and an inner circumferential surface of the opening.

2. The vortex water flow generator according to claim 1, wherein shapes of the openings of the middle partition and the-other-end-side partition gradually increase in size in an order as far from the negative electrode.

3. The vortex water flow generator according to claim 1, wherein a plurality of middle partitions are provided.

4. The vortex water flow generator according to claim 1, wherein the tapered surface is curved to be recessed along a bowl-shaped surface.

5. The vortex water flow generator according to claim 1, wherein the cylindrical portion has a channel for passing water from the outside to the inside thereof,
each of the channel and the cylindrical portion has a cylindrical inner circumferential surface, and
the inner circumferential surface of the channel linearly overlaps with a tangential position of the cylindrical portion.

6. The vortex water flow generator according to claim 5, wherein the channel is formed between the neighboring partitions.

7. The vortex water flow generator according to claim 5, wherein a plurality of the channels are formed along a circumferential direction of the cylindrical portion to be in an identical position in an extension direction of the center axis line.

8. The vortex water flow generator according to claim 1, wherein each of the partitions is detachably installed in the cylindrical portion.

9. A water plasma generator comprising:
the vortex water flow generator according to claim 1;
a chamber configured to house the vortex water flow generator; and
a positive electrode and a negative electrode configured to generate arc discharge,
wherein the vortex water flow generator is placed between the negative electrode and the positive electrode to form a vortex water flow through which arc discharge generated between the negative and positive electrodes passes.

10. A decomposition processor comprising:
the water plasma generator according to claim 9; and
a supply device configured to supply a decomposition target object to water plasma injected from the water plasma generator,
wherein the decomposition target object is decomposed by the water plasma.

11. The decomposition processor according to claim 10, wherein the supply device has a nozzle for providing the decomposition target object from a tip, and
the tip of the nozzle is placed inside of the water plasma jet stream.

12. The decomposition processor according to claim 11, wherein the tip of the nozzle is placed in a space formed by extending the opening of the injection port along the center axis line.

13. The decomposition processor according to claim 11, wherein the tip of the nozzle is placed in a space formed by extending the negative electrode along the center axis line.

14. The decomposition processor according to claim 11, wherein the tip of the nozzle is placed to match or overlap with a center axis line position of the injection port.

15. The decomposition processor according to claim 11, wherein the nozzle has a cooling structure that flows a coolant to the inside of the tip, and
the cooling structure includes:
a first channel through which the decomposition target object passes;
a second channel provided in an outer side of the first channel to pass the coolant from a basal end side of the nozzle to the tip side; and
a third channel provided in an outer side of the second channel to communicate with the second channel in the tip side and pass the coolant from the tip side to the basal end side.

16. The decomposition processor according to claim 11, further comprising:
an exhaust gas disposer having a treatment space for disposing a gas generated by decomposing the decomposition target object;
a wall body that partitions the inside and the outside of the treatment space; and
a cylindrical container configured to house the positive electrode and the injection port to discharge the gas to the treatment space,
wherein the nozzle is supported by the container, and
the container has a thickness within which a space for flowing the coolant is formed.

17. A decomposition processor mounted vehicle comprising the decomposition processor according to claim 10, wherein the decomposition processor is mounted on a cargo box of a truck.

18. A decomposition method comprising:
supplying the decomposition target object to the water plasma injected from the water plasma generator according to claim 9; and
decomposing the decomposition target object.

* * * * *